United States Patent

Yonemoto et al.

[11] Patent Number: 6,166,769
[45] Date of Patent: Dec. 26, 2000

[54] SOLID-STATE IMAGING DEVICE

[75] Inventors: Kazuya Yonemoto, Tokyo; Ryoji Suzuki, Kanagawa, both of Japan

[73] Assignee: Sony Corporation, Tokyo, Japan

[21] Appl. No.: 08/831,640

[22] Filed: Apr. 9, 1997

[30] Foreign Application Priority Data

Apr. 10, 1996 [JP] Japan ................................. 8-088492
Jun. 27, 1996 [JP] Japan ................................. 8-166524

[51] Int. Cl.[7] .......................... H04N 3/14; H04N 5/335; H04N 5/217
[52] U.S. Cl. ........................ 348/308; 348/303; 348/241
[58] Field of Search .................................. 348/241, 250, 348/202, 303, 307, 308

[56] References Cited

U.S. PATENT DOCUMENTS

| | | | |
|---|---|---|---|
| 4,839,729 | 6/1989 | Ando et al. | 348/241 |
| 4,942,474 | 7/1990 | Akimoto et al. | 348/241 |
| 5,396,289 | 3/1995 | Nakamura | 348/302 |
| 5,434,619 | 7/1995 | Yonemoto | 348/241 |
| 5,717,458 | 2/1998 | Yonemoto | 348/303 |
| 5,771,070 | 6/1998 | Ohzu et al. | 348/241 |
| 5,796,431 | 8/1998 | Yonemoto | 348/308 |

Primary Examiner—Wendy Garber
Assistant Examiner—Alicia M. Harrington
Attorney, Agent, or Firm—Hill & Simpson

[57] ABSTRACT

A solid-state imaging device has a matrix of pixels arranged in rows and columns, a first signal holding circuit for holding a first signal transferred from each of the pixels through a vertical signal line, a second signal holding circuit for holding a second signal transferred from the each pixel through the vertical signal line, and a horizontal signal line group connected to the first signal holding circuit and the second signal holding circuit. The first signal holding circuit and the second signal holding circuit are axially symmetrically positioned one on each side of the horizontal signal line group.

8 Claims, 19 Drawing Sheets

SOLID-STATE IMAGING DEVICE

BACKGROUND OF THE INVENTION

The present invention relates to a solid-state imaging device, and more particularly to a solid-state imaging device which is capable of removing fixed pattern noise of pixels and fixed pattern noise caused by a shading that is generated by a horizontal scanning circuit. More specifically, the present invention is concerned with an X-Y addressable solid-state imaging device which is capable of reading pixel information, pixel by pixel, depending on a signal charge which has been generated by each pixel through photoelectric conversion.

To meet demands for higher-resolution solid-state imaging devices, there have been developed in recent years amplification-type solid-state imaging devices which are free of smearing and capable of realizing fine pixels, for use in place of CCD solid-state imaging devices. The amplification-type solid-state imaging devices have pixels comprising active devices of MOS structure (MOS transistors) for enabling the pixels to amplify light signals, and are arranged to read charges stored in the pixels by photoelectric conversion as signals that are current-modulated by the transistors.

Since the pixels of the amplification-type solid-state imaging devices comprise active devices (MOS transistors) variations of the active devices are reflected in video signals generated by the amplification-type solid-state imaging devices. Since such variations of the active devices have fixed values associated with the respective pixels, they appear as fixed pattern noise (hereinafter also referred to as "FPN") in the reproduced image.

The FPN is caused not by variations in pixel sensitivity to incident light, but by threshold variations of the pixels which are added to signals depending on incident light.

Removal of FPN will be described below with respect to a conventional amplification-type solid-state imaging device shown in FIG. 1 of the accompanying drawings.

As shown in FIG. 1, the amplification-type solid-state imaging device, generally denoted by 1, has photodetectors 2 each serving as a unit pixel (cell), the photodetectors 2 comprising pixel MOS transistors, respectively, which are arranged in a matrix of rows and columns. The pixel MOS transistors 2 in the rows have control electrodes or gates connected to vertical selection lines 4 associated with the respective rows. The amplification-type solid-state imaging device 1 also has a vertical scanning circuit 3 for applying a vertical scanning signal, i.e., vertical scanning pulses $\phi V$ ($\phi V_1, \ldots, \phi V_m, \phi V_{m+1}, \ldots$), successively to the vertical selection lines 4.

The pixel MOS transistors 2 in the columns have respective sources, i.e., one type of principal electrodes thereof, connected to vertical signal lines 5 associated with the respective columns, and also have respective drains, i.e., the other type of principal electrodes thereof, connected to a power supply $V_D$.

Each of the vertical signal lines 5 is connected through a first operation MOS switch 7 to a first load capacitance element 8 for holding a signal voltage (charge). The junction between the first operation MOS switch 7 and the first load capacitance element 8 is connected through a first horizontal MOS switch 9 to a first horizontal signal line 10. Each of the vertical signal lines 5 is also connected through a second operation MOS switch 7' to a second load capacitance element 8'. The junction between the second operation MOS switch 7' and the second load capacitance element 81 is connected through a second horizontal MOS switch 9' to a second horizontal signal line 11. The first and second load capacitance elements 8, 8' are connected between the vertical signal lines 5 and ground.

A first operation pulse $\phi_{OPS}$ is applied to the gate of each of the first operation MOS switches 7, and a second operation pulse $\phi_{OPN}$ is applied to the gate of each of the second operation MOS switches 7'. The first and second horizontal MOS switches 9, 9' have respective gates connected in common to a horizontal shift register 12, which applies a horizontal scanning signal, i.e., successive horizontal scanning pulses $\phi H$ ($\phi H_1, \ldots, \phi H_n, \phi H_{n+1}, \ldots$), to the first and second horizontal MOS switches 9, 9'.

Resetting MOS switches (not shown) for resetting the first and second load capacitance elements 8, 8' and the vertical signal lines 5 to an initial voltage are connected to the vertical signal lines 5 on the side of the first load capacitance elements 8 in which the first operation MOS switches 7 are present. The resetting MOS switches have respective sources connected to the vertical signal lines 5, respective drains supplied with a resetting bias voltage $V_{RB}$, and respective gates supplied with a resetting pulse $\phi_{VRST}$.

The first operation MOS switches 7, the first load capacitance elements 8, and the first horizontal MOS switches 9 jointly make up a first signal holding circuit 19 for holding signal voltages (charges) of pixels before the pixels are reset. The second operation MOS switches 7', the second load capacitance elements 8', and the second horizontal MOS switches 9' jointly make up a second signal holding circuit 20 for holding signals from pixels after the pixels are reset, i.e., noise signals.

The first and second horizontal signal lines 10, 11 have respective output ends connected to respective first and second charge detecting circuits 16, 16' each comprising an operational amplifier 13 in the form of an inverting amplifier, e.g., a differential amplifier, a detection capacitance element 14, and a resetting switch 15. Specifically, the first and second horizontal signal lines 10, 11 are connected to respective inverting input terminals of the operational amplifiers 13 of the respective charge detecting circuits 16, 16'. A predetermined bias voltage $V_B$ is applied to the noninverting input terminals of the operational amplifiers 13. The bias voltage $V_B$ serves to determine a potential of the first and second horizontal signal lines 10, 11. In each of the first and second charge detecting circuits 16, 16', the detection capacitance element 14 is connected across the operational amplifier 13, i.e., between the inverting input terminal and output terminal of the operational amplifier 13, and the resetting switch 15 is connected across the detection capacitance element 14 for resetting the first and second horizontal signal lines 10, 11 and the detection capacitance element 14. The resetting switch 15 has a gate to which a resetting pulse $\phi_R$ will be applied.

The first and second charge detecting circuits 16, 16' have respective output terminals, i.e., a signal output terminal $t_S$ and a noise output terminal $t_N$, which are connected to a differential amplifier 17 which subtracts signals at the signal output terminal $t_S$ and the noise output terminal $t_N$ one from the other.

The amplification-type solid-state imaging device 1 operates as follows: A signal outputted from the principal electrodes of each of the pixel MOS transistors 2 depending on a signal charge converted from incident light and stored therein (i.e., a signal before the pixel is reset=a signal converted from incident light+fixed pattern noise (FPN) of the pixel) is transferred from the vertical signal line 5 through the first operation MOS switch 7 to the first load capacitance element 8, which holds (stores) the supplied signal.

After each of the pixel MOS transistors 2 is reset, a signal outputted from the principal electrodes of the pixel MOS transistor 2 (i.e., a signal after the pixel is reset=only fixed pattern noise (FPN) of the pixel) is transferred from the vertical signal line 5 through the second operation MOS switch 7' to the second load capacitance element 8', which holds (stores) the supplied signal.

When the first and second horizontal MOS switches 9, 9' are rendered conductive, the signal before the pixel is reset, which is stored in the first load capacitance element 8, and the signal after the pixel is reset, which is stored in the second load capacitance element 8', are outputted respectively through the first and second horizontal signal lines 10, 11 and the first and second charge detecting circuits 16, 16' to the respective output terminals $t_S$, $t_N$, from which the signals are supplied to the differential amplifier 17. The differential amplifier 17 subtracts the signal after the pixel is reset from the signal before the pixel is reset, thereby removing the FPN, and outputs the signal free of FPN to an output terminal $t_{out}$.

However, the amplification-type solid-state imaging device 1 suffers disadvantageous described below. The amplification-type solid-state imaging device 1 needs two output circuits for outputting signals before and after the pixels are reset, i.e., the first and second charge detecting circuits 16, 16'. Furthermore, while the amplification-type solid-state imaging device 1 can remove FPN generated by the pixel MOS transistors 2, if the two signals before and after the pixels are reset contain shadings of different magnitudes due to a slight difference between the layouts of the first and second signal holding circuits 19, 20, then a shading remains unremoved from the signal outputted to the output terminal $t_{out}$ even when the signals before and after the pixels are reset are subtracted one from the other by the differential amplifier 17.

More specifically, the layout of the first operation MOS switches 7, the first load capacitance elements 8, and the first horizontal MOS switches 9, and the layout of the second operation MOS switches 7', the second load capacitance elements 8', and the second horizontal MOS switches 9' differ positionally from each other, and the operation pulses $\phi_{OPS}$, $\phi_{OPN}$ and the horizontal scanning pulses $\phi H_n$, $\phi H_{n+1}$ are not exactly equivalent to each other. As a consequence, a signal produced at the output terminal $t_S$ (a signal converted from incident light+fixed pattern noise (FPN) of the pixels) and a signal produced at the output terminal $t_N$ (only fixed pattern noise (FPN) of the pixels) suffer different shadings as shown in FIG. 2 of the accompanying drawings, with the result that the output signal at the output terminal tout, from which FPN is canceled, still contains a shading.

Therefore, the above amplification-type solid-state imaging device in which the signals produced before and after the pixels are reset are outputted from the respective separate circuits and then subtracted one from the other to remove FPN of the pixels from the output signal has been problematic because the output signal from which FPN is canceled tends to contain a shading generated by the horizontal scanning circuit.

The amplification-type solid-state imaging devices, which are one type of X-Y addressable solid-state imaging device, employ active devices of MOS structure (MOS transistors) as pixels to give the pixels an amplifying capability. As described above, variations of the active devices are reflected in video signals generated by the amplification-type solid-state imaging devices, and have fixed values associated with the respective pixels. Therefore, the variations appear as fixed pattern noise (FPN) in the produced image. The FPN is caused by threshold variations of the pixels which are added to signals depending on incident light, rather than by variations in pixel sensitivity to incident light.

FIG. 3 of the accompanying drawings show another amplification-type solid-state imaging device arranged to remove FPN caused by characteristic variations of the pixels. As shown in FIG. 3, the amplification-type solid-state imaging device has a pixel area 101 comprising a matrix of pixels arrayed in rows and columns, a vertical scanning circuit 102 disposed on one side of the pixel area 101 for successively selecting the rows of pixels in the pixel area 101, and noise and signal horizontal scanning circuits 103, 104 disposed upwardly and downwardly, respectively, of the pixel area 101 for successively selecting the columns of pixels in the pixel area 101.

Signals are read from the pixels as follows: Signals (containing noise components) of pixels belonging to a row selected by the vertical scanning circuit 102 are successively read in a horizontal scanning cycle by the signal horizontal scanning circuit 104. After the pixels are reset, the noise components of the pixels of the same row are successively read in a horizontal scanning cycle by the noise horizontal scanning circuit 103. Thereafter, the noise components are subtracted from the signals by an external signal processing circuit (not shown in FIG. 3), thereby canceling fixed pattern noise contained in the signals.

In the amplification-type solid-state imaging device shown in FIG. 3, the noise and signal horizontal scanning circuits 103, 104 are disposed upwardly and downwardly, respectively, of the pixel area 101, and signals and noise components of the pixels are read through respective signal reading circuits separate from each other. While the amplification-type solid-state imaging device is able to remove fixed pattern noise caused by characteristic variations of the active devices of the pixels, it fails to remove noise components due to characteristic variations of devices of the signal reading circuits and the horizontal scanning circuits 103, 104. Such noise components which remain unremoved appear as vertical stripes of fixed pattern noise in the reproduced image.

SUMMARY OF THE INVENTION

It is therefore an object of the present invention to provide a solid-state imaging device which is capable of removing both fixed pattern noise of pixels and a shading generated by a horizontal scanning circuit.

Another object of the present invention is to provide a solid-state imaging device which can reliably eliminate fixed pattern noise due to characteristic variations of devices of signal reading circuits and a horizontal scanning circuit.

According to the present invention, there is provided a solid-state imaging device comprising a matrix of pixels arranged in rows and columns, a first signal holding circuit for holding a first signal transferred from each of the pixels, a second signal holding circuit for holding a second signal transferred from the each pixel, and a horizontal signal line group connected to the first signal holding circuit and the second signal holding circuit, the first signal holding circuit and the second signal holding circuit being positioned one on each side of the horizontal signal line group.

According to the present invention, there is also provided a solid-state imaging device comprising a pixel area comprising a plurality of pixels arranged in rows and columns, a plurality of vertical signal lines connected respectively to the columns of the pixels, a vertical scanning circuit for controlling control electrodes of the pixels in the rows which are connected in common by the vertical selection lines, common operation switches having terminals connected respectively to the vertical selection lines for reading signals from the pixels in the columns, first and second capacitors associated with each of the vertical signal lines, a signal operation switch for storing a signal at other terminals of the common operation switches in the first capacitor and reading the stored signal from the first capacitor, a noise operation switch for storing a noise at the other terminals of the common operation switches in the second capacitor and reading the stored noise from the second capacitor, a horizontal switch for outputting the signal and the noise read from the first and second capacitors, to a horizontal signal line, and a horizontal scanning circuit for supplying drive signals to the signal operation switch, the noise operation switch, and the horizontal switch.

DETAILED DESCRIPTION OF THE PREFERRED EMBODIMENTS

Figure 1:
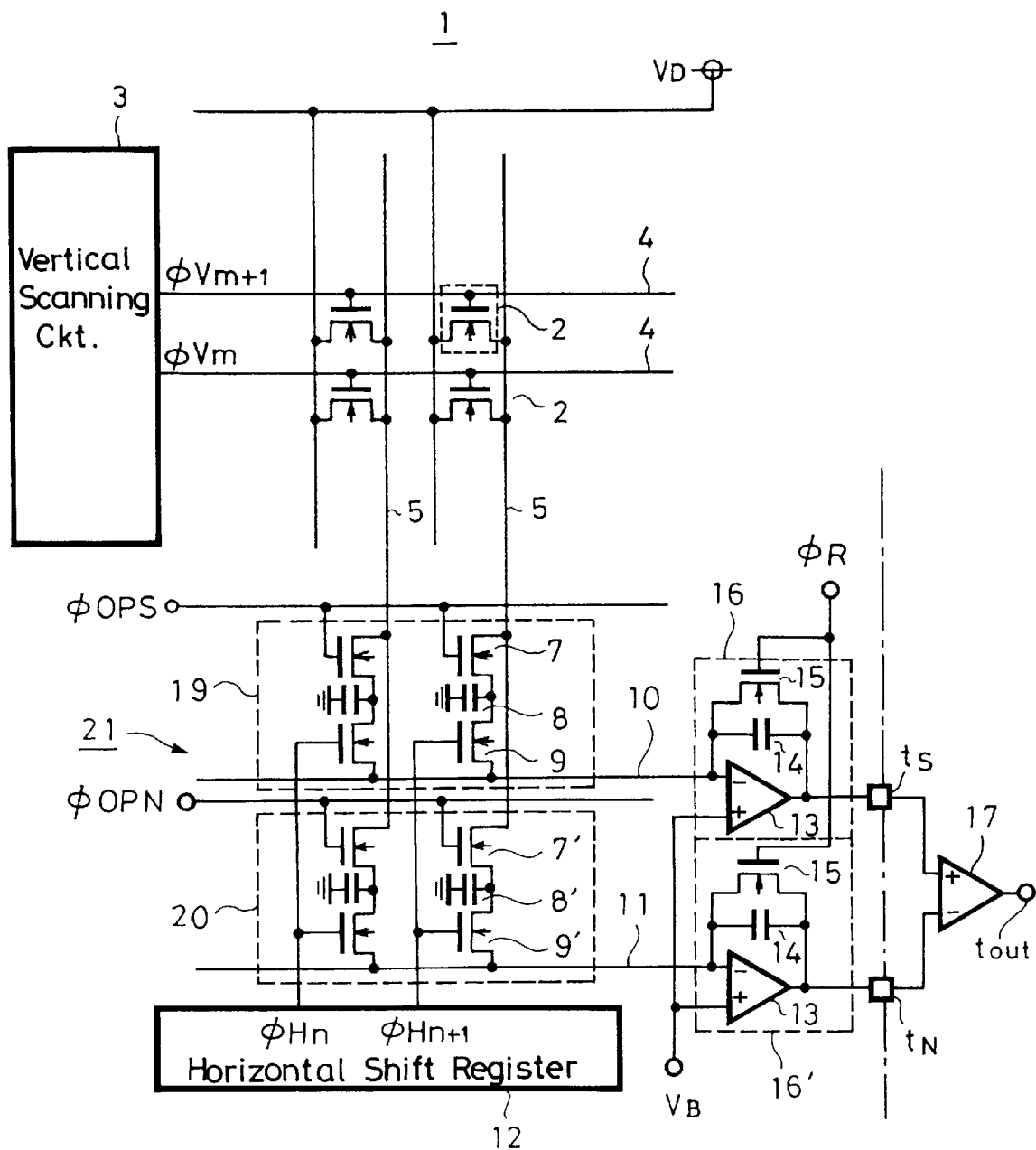
FIG. 1 is a circuit diagram, partly in block form, of a conventional amplification-type solid-state imaging device.
Figure 2:
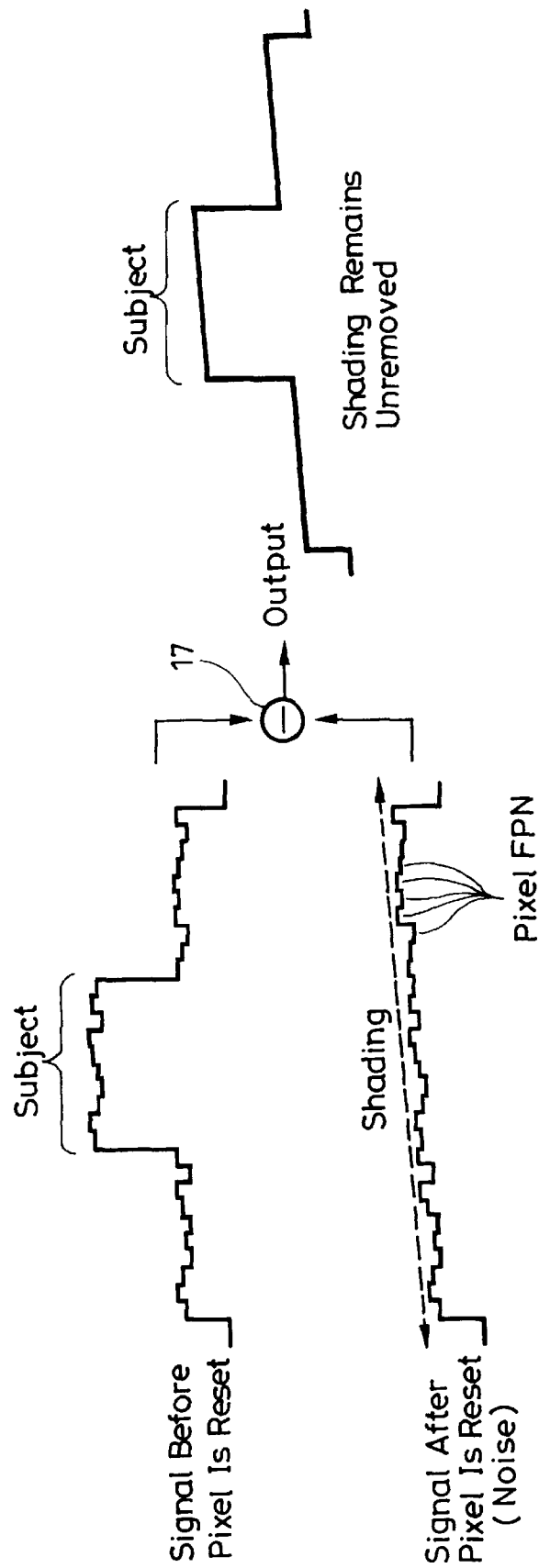
FIG. 2 is a diagram showing signal waveforms in the amplification-type solid-state imaging device shown in FIG. 1.
Figure 3:
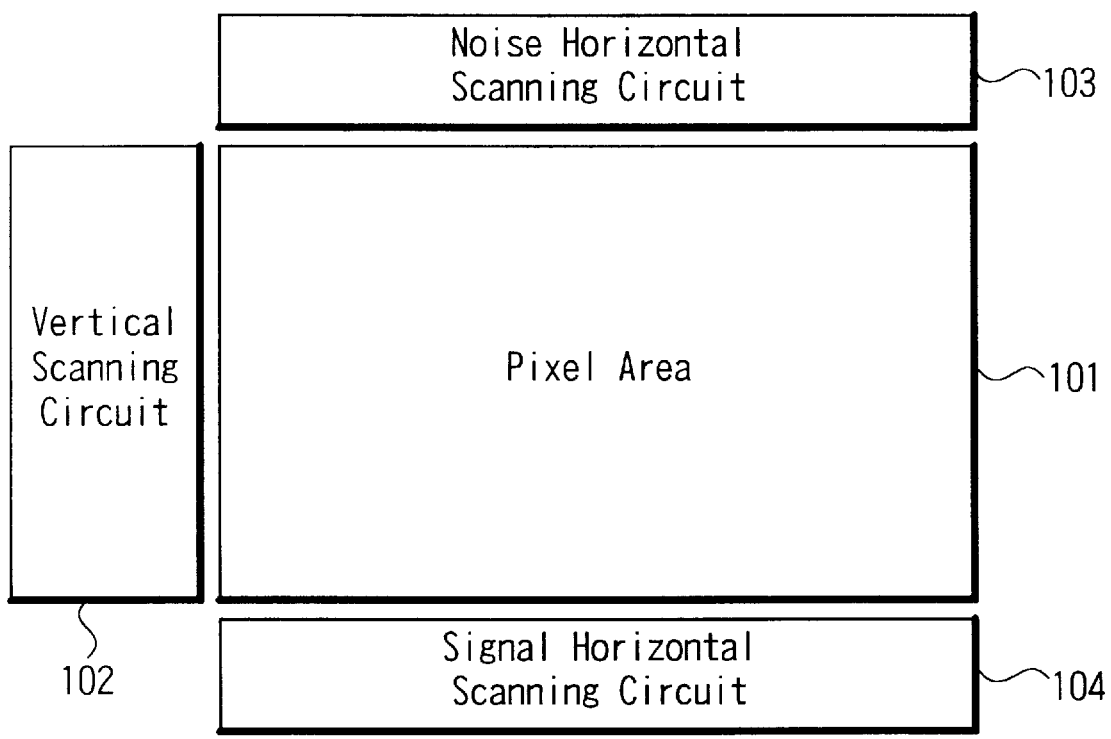
FIG. 3 is a block diagram of another conventional amplification-type solid-state imaging device.

Like reference numerals or representations denote like parts throughout views.

Figure 4:
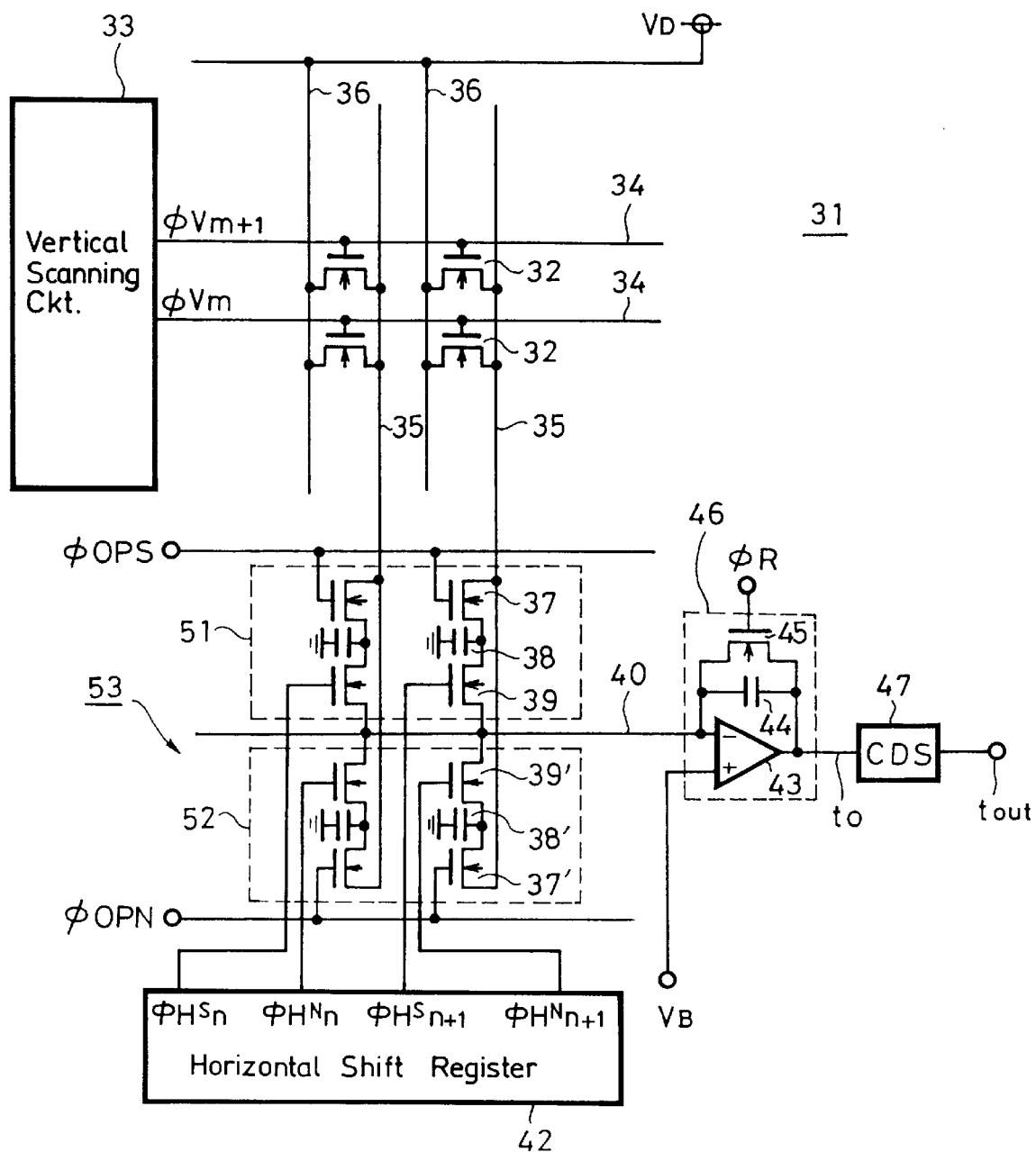
FIG. 4 is a circuit diagram, partly in block form, of an amplification-type solid-state imaging device according to a first embodiment of the present invention.

FIG. 4 shows, partly in block form, of a circuit arrangement of an amplification-type solid-state imaging device according to a first embodiment of the present invention.

The amplification-type solid-state imaging device shown in FIG. 4 is an X-Y addressable solid-state imaging device having fixed pattern noise (FPN) which is primarily caused by individual variations of pixels and horizontal irregularities of a horizontal scanning circuit. The solid-state imaging device is scanned to output signals before and after the pixels are reset, and these signals are subjected to a correlated double signal sampling process to remove the FPN and shading from the signals.

As shown in FIG. 4, the amplification-type solid-state imaging device, generally denoted by 31, has pixel, transistors 32, e.g., pixel MOS transistors, each serving as a unit pixel (cell), which are arranged in a matrix of rows and columns. The pixel MOS transistors 32 in the same rows are controlled and selected by a vertical scanning circuit 33 comprising a shift register or the like. The pixel MOS transistors 32 in the rows have control electrodes or gates connected to vertical selection lines 34 associated with the respective rows. The vertical scanning circuit 33 applies vertical scanning pulses $\phi V$ ($\phi V_1, \ldots, \phi V_m, \phi V_{m+1}, \ldots$) successively to the vertical selection lines 34.

The pixel MOS transistors 32 in the columns have respective sources, i.e., one type of principal electrodes thereof, connected to vertical signal lines 35 associated with the respective columns, and also have respective drains, i.e., the other type of principal electrodes thereof, connected to power supply lines 36 which are connected to a power supply $V_D$.

Each of the vertical signal lines 35 is connected through a first operation switch 37 such as a MOS switch controlled by an operation pulse $\phi_{OPS}$ to a first load capacitance element 38 for holding a signal (=a signal converted from incident light+fixed pattern noise of a pixel) which corresponds to a signal charge stored in the pixel MOS transistor before the pixel is reset. The first load capacitance element 38 is connected between the vertical signal line 35 and a first potential which is a ground potential in this embodiment. A first horizontal switch 39 such as a MOS switch which is controlled by a horizontal shift register 42 is connected between the first load capacitance element 38 and a single horizontal signal line 40.

Each of the vertical signal lines 35 is also connected through a second operation switch 37' such as a MOS switch controlled by an operation pulse $\phi_{OPN}$ to a second load capacitance element 38' for holding a signal (=only fixed pattern noise of a pixel) which is free of a signal charge after the pixel is reset. The second load capacitance element 38' is connected between the vertical signal line 35 and the first potential. A second horizontal switch 39' such as a MOS switch which is controlled by the horizontal shift register 42 is connected between the second load capacitance element 38' and the horizontal signal line 40.

The horizontal shift register 42 applies successive horizontal scanning pulses $\phi HS$ ($\phi HS_1, \ldots, \phi HS_n, \phi HS_{n+1}, \ldots$) to the gates of the first horizontal switches 39, and also applies successive horizontal scanning pulses $\phi HN$ ($\phi HN_1, \ldots, \phi HN_n, \phi HN_{n+1}, \ldots$) to the gates of the second horizontal switches 39'.

The first operation switches 37, the first load capacitance elements 38, and the first horizontal switches 39 jointly make up a first signal holding circuit 51 for holding signals of the pixel MOS transistors before the pixels are reset. The second operation switches 37', the second load capacitance elements 38', and the second horizontal switches 39' jointly make up a second signal holding circuit 52 for holding signals of the pixel MOS transistors after the pixels are reset.

The first and second signal holding circuits 51, 52, the horizontal signal line 40, and the horizontal shift register 42 jointly make up a horizontal scanning circuit 53.

The layout of the first operation switches 37, the first load capacitance elements 38, and the first horizontal switches 39 and the layout of the second operation switches 37', the second load capacitance elements 38', and the second horizontal switches 39' are vertically axially symmetrical with respect to the horizontal signal line 40 that is positioned between these layouts.

Resetting switches such as MOS switches (not shown) for resetting the first and second load capacitance elements 38, 38' and the vertical signal lines 35 to an initial voltage are connected to the vertical signal lines 35 on the side of the first load capacitance elements 38 in which the first operation switches 37 are present. The resetting MOS switches have respective sources connected to the vertical signal lines 35, respective drains supplied with a resetting bias voltage $V_{RB}$, and respective gates supplied with a resetting pulse $\phi_{VRST}$.

The horizontal signal line 40 has an output end connected to an output circuit, i.e., a charge detecting circuit 46 comprising an operational amplifier 43 in the form of an inverting amplifier, e.g., a differential amplifier, a detection capacitance element 44, and a resetting switch 45 such as a resetting MOS switch. The charge detecting circuit 46 has an output terminal connected to a correlated double signal sampling (CDS) circuit 47 which performs a correlated double signal sampling operation.

The horizontal signal line 40 is connected to an inverting input terminal of the operational amplifier 43 of the charge detecting circuit 46. A predetermined bias voltage V. is applied to the noninverting input terminal of the operational amplifier 43. In the charge detecting circuit 46, the detection capacitance element 44 and the resetting switch 45 are connected across the operational amplifier 43, i.e., between the inverting input terminal and output terminal of the operational amplifier 43. The resetting switch 45, which serves to reset the horizontal signal line 40 and the detection capacitance element 44, has a gate to which a resetting pulse $\phi_R$ will be applied.

Figure 5:
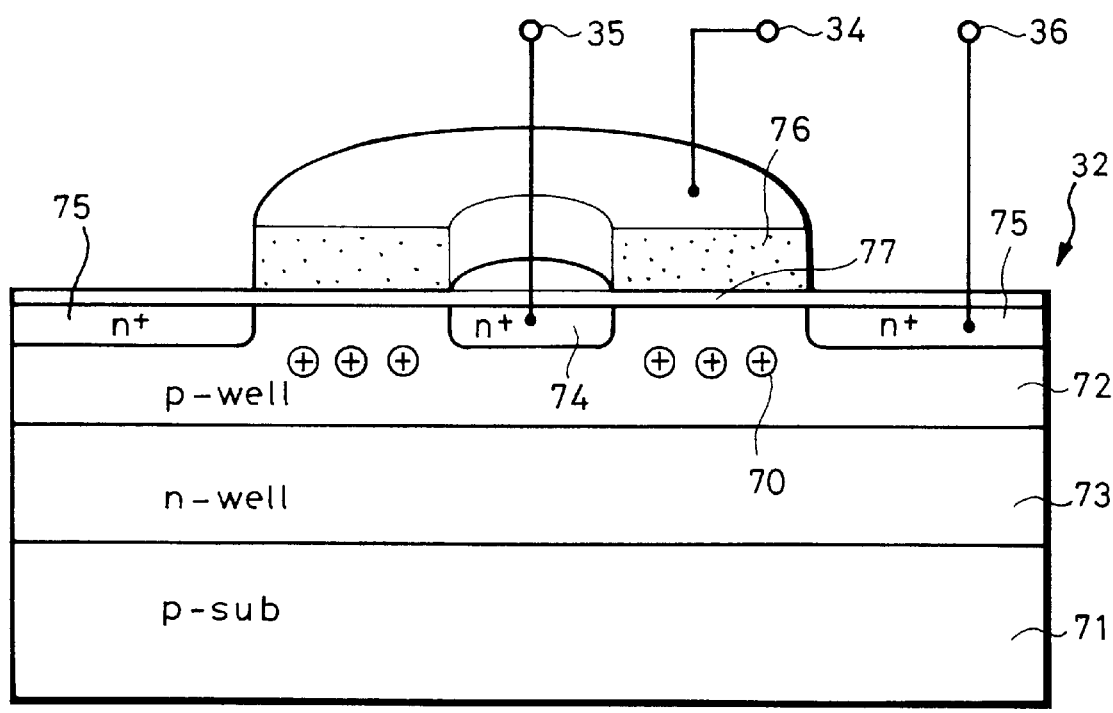
FIG. 5 is an enlarged cross-sectional view of a semiconductor structure of a pixel MOS transistor.

FIG. 5 shows in enlarged cross section a semiconductor structure of each of the unit pixels, i.e., the pixel MOS transistors 32. In FIG. 5, the unit pixel has a semiconductor substrate 71 of a first conductivity type, e.g., a p type, a p-type well region 72 for storing signal charges, i.e., holes 70, converted from incident light, and a well region 73 of a second conductivity type, e.g., an n type. The p-type well region 72 has an n-type source region 74 and an n-type drain region 75. An annular gate electrode 76 of thin-film polycrystalline silicon which can transmit light therethrough is disposed on a gate insulating film 77 over the portion of the p-type well region 72 which extends between the n-type source region 74 and the n-type drain region 75. Holes 70 converged from incident light and stored in the p-type well region 72 directly below the gate electrode 76 control a channel current (drain current) in a readout mode, and a change in the channel current is extracted as an output signal.

Operation of the amplification-type solid-state imaging device 31 will be described below.

The vertical scanning circuit 33 outputs vertical scanning pulses $\phi V$ ($\phi V_1, \ldots, \phi V_m, \phi V_{m+1}, \ldots$) successively to the vertical selection lines 34 to successively select the rows of the pixel MOS transistors 32, placing the pixel MOS transistors 32 in the successively selected rows in a readout mode. A pixel signal from the principal electrodes of each of the pixel MOS transistors 32 depending on a signal charge converted from incident light and stored therein (i.e., a signal before the pixel is reset) is outputted to the vertical signal line 35, and transferred from the vertical signal line 35 to the first load capacitance element 38 when the first operation switch 37 is turned off, on, and off again. The first load capacitance element 38 holds (stores) the supplied pixel signal.

After the signal charges stored in the pixel MOS transistors 32 in the same column are reset, a pixel signal from the principal electrodes of each of the pixel MOS transistors 32 (i.e., a signal after the pixel is reset) is outputted to the vertical signal line 35, and transferred from the vertical signal line 35 to the second load capacitance element 38' when the second operation switch 37' is turned off, on, and off again. The second load capacitance element 38' holds (stores) the supplied pixel signal.

When the first horizontal switch 39 connected to the horizontal signal line 40 is turned on by a horizontal scanning pulse $\phi HS$ from the horizontal shift register 42, the first load capacitance element 38 outputs the stored pixel signal as a signal charge to the horizontal signal line 40 which has been reset. The signal charge is transferred from the horizontal signal line 40 to the charge detecting circuit 46, which demodulates the signal charge into a signal voltage that is outputted to its output terminal to.

After the horizontal signal line 40 is reset again by the resetting switch 45 of the charge detecting circuit 46, the second horizontal switch 39' connected to the horizontal signal line 40 is turned on by a horizontal scanning pulse OHN from the horizontal shift register 42. The second load capacitance element 38' now outputs the stored pixel signal as a signal charge to the horizontal signal line 40. The signal charge is transferred from the horizontal signal line 40 to the charge detecting circuit 46, which demodulates the signal charge into a signal voltage that is outputted to its output terminal $t_o$.

The signal voltages successively outputted to the output terminal $t_o$ before and after the pixel is reset are then subjected to a correlated double signal sampling process by the CDS circuit 47, which removes FPN (fixed pattern noise) of the pixel and also fixed pattern noise due to a shading generated by the horizontal scanning circuit 53.

Figure 6:
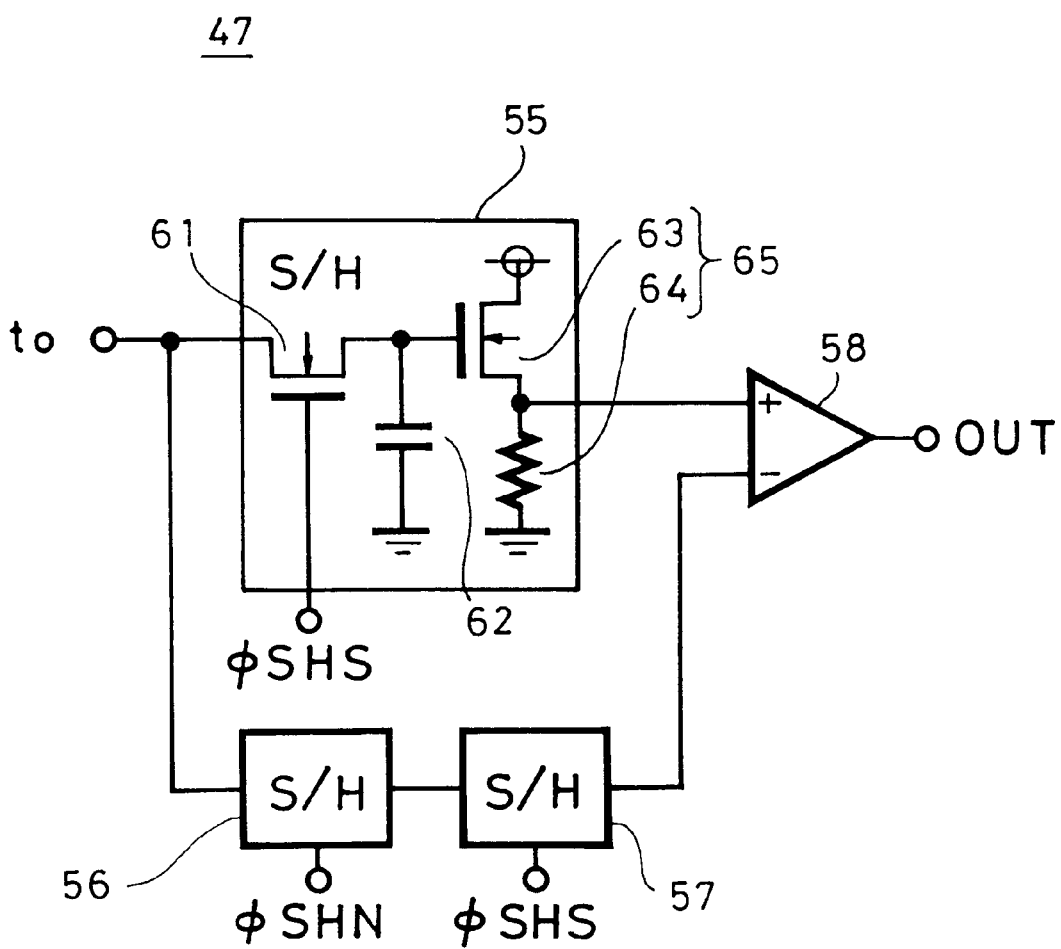
FIG. 6 is a circuit diagram, partly in block form, of a CDS circuit in the amplification-type solid-state imaging device shown in FIG. 4.

Details of the CDS circuit 47 shown in FIG. 4 are illustrated in FIG. 6.

The CDS circuit 47 comprises a first sample and hold circuit 55 which belongs to one circuit path, second and third sample and hold circuits 56, 57 which belong to another circuit path, and a differential amplifier 58. The first sample and hold circuit 55 has an output terminal connected to a noninverting input terminal of the differential amplifier 58. The second and third sample and hold circuits 56, 57 are connected in series to each other, and the third sample and hold circuit 57 has an output terminal connected to an inverting input terminal of the differential amplifier 58.

Each of the sample and hold circuits 55, 56, 57 comprises a MOS switch 61, a memory capacitance element 62, and a source follower 65 comprising a MOS transistor 63 and a load resistor 64. The MOS switch 61 of the first sample and hold circuit 55 is controlled by a first sampling pulse φSHS. The MOS switch 61 of the second sample and hold circuit 56 is controlled by a second sampling pulse φSHN. The MOS switch 61 of the third sample and hold circuit 57 is controlled by the first sampling pulse φSHS.

The two signals which are out of phase with each other, i.e., the signals produced before and after the pixel is reset, outputted from the output terminal $t_o$ of the charge detecting circuit 46 are sampled respectively by the sample and hold circuit 55 and the sample and hold circuits 56, 57, and then supplied to the differential amplifier 58, which outputs the difference between those signals produced before and after the pixel is reset. Specifically, the signal produced before the pixel is reset is sampled by the first sample and hold circuit 55 with the first sampling pulse φSHS, and then applied to the noninverting input terminal (+) of the differential amplifier 58. The signal produced after the pixel is reset is sampled by the second sample and hold circuit 56 with the second sampling pulse φSHN, and then sampled by the third sample and hold circuit 57 with the first sampling pulse φSHS so as to be brought into phase with the signal produced before the pixel is reset, after which it is applied to the inverting input terminal (−) of the differential amplifier 58. The differential amplifier 58 produces a differential signal representative of the difference between those signals produced before and after the pixel is reset, from an output terminal $t_{out}$.

Figure 7:
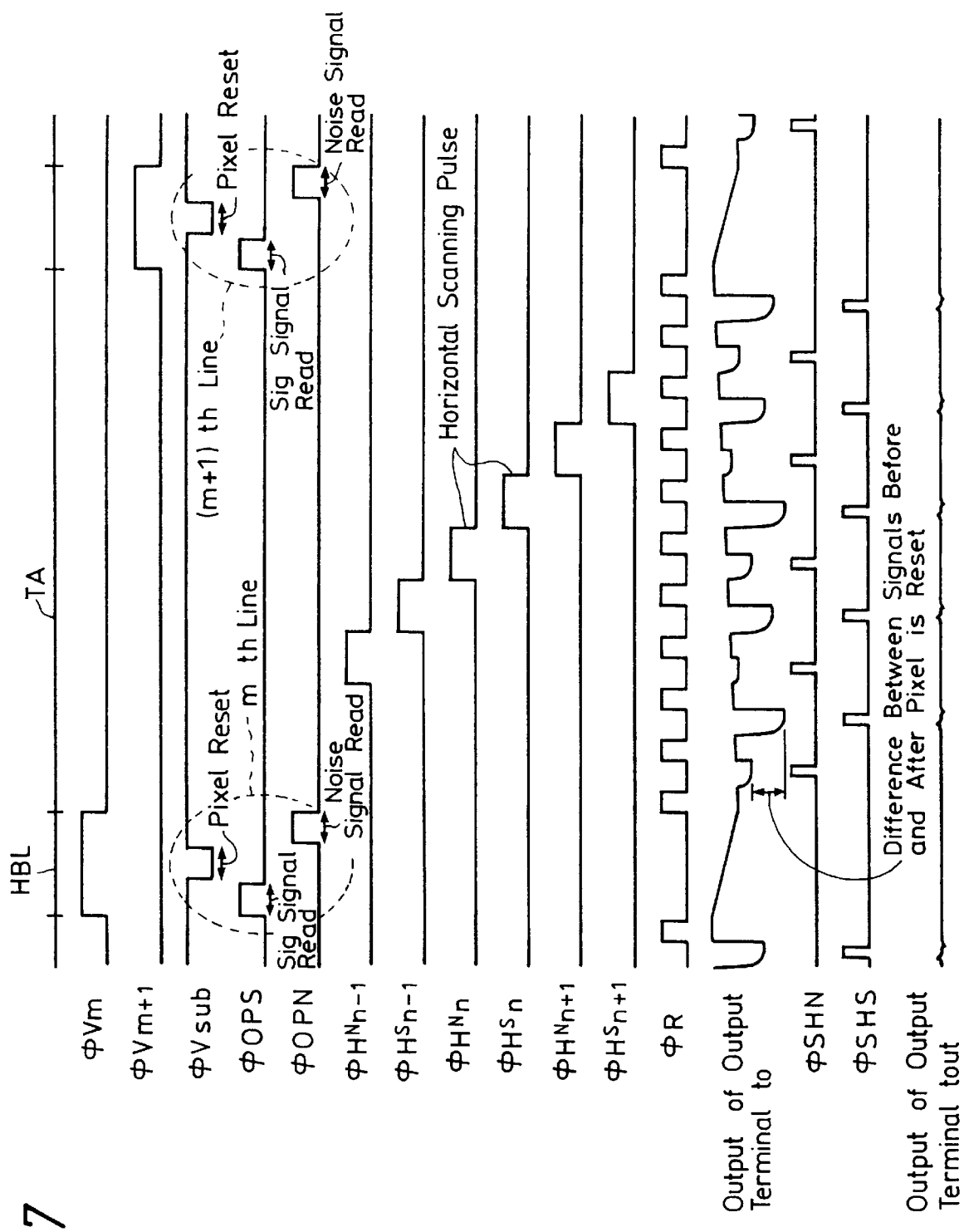
FIG. 7 is a timing chart showing signal waveforms illustrative of the manner in which the amplification-type solid-state imaging device according to the first embodiment operates.

FIG. 7 shows signal waveforms illustrative of the manner in which the amplification-type solid-state imaging device 31 according to the first embodiment operates.

In a horizontal blanking interval HBL (shown in a left-hand side of FIG. 7), a vertical scanning pulse φV$_m$ of a high voltage level is outputted from the vertical scanning circuit 42 to one of the vertical selection lines 34 to select an mth row of pixel MOS transistors 32.

Each of the pixel MOS transistors 32 of the selected mth row outputs a signal (Sig signal) before the pixel is reset to the corresponding vertical signal line 35. An operation pulse φ$_{OPS}$ is applied to the control electrode of the first operation switch 37 to store the Sig signal in the first load capacitance element 38.

Thereafter, a negative pixel resetting pulse φV$_{sub}$ is applied to the substrate to reset the signal charges of the pixel MOS transistors 32 of the selected mth row.

After the pixel MOS transistors 32 are reset, a signal (Noise signal) after the pixel is reset, which is outputted from each of the pixel MOS transistors 32 to the corresponding vertical signal line 35, is stored in the second load capacitance element 38' by applying an operation pulse φ$_{OPN}$ to the control electrode of the second operation switch 37'.

In the above cycle of operations, the signals produced before and after each of the pixel MOS transistors 32 of the mth row is reset are stored respectively by the first and second load capacitance elements 38, 39'. In a horizontal video signal interval TA, a horizontal scanning pulse φHS (φHS$_1$, ..., φHS$_n$, φHS$_{n+1}$, ...) and a horizontal scanning pulse φHN (φHN$_1$, ..., φHN$_n$, φHN$_{n+1}$, ...) which are outputted from the horizontal shift register 42 are alternately applied, respectively before and after a resetting pulse φ$_R$ for resetting the horizontal signal line 40, to turn on the horizontal switches 39, 39' successively for thereby allowing the charge detecting circuit 46 to output the signal (Noise signal) after the pixel is reset and the signal (Sig signal) before the pixel is reset alternately from the charge detecting circuit 46.

The signals alternately outputted from the charge detecting circuit 46 are supplied to the CDS circuit 47 which is controlled by the sampling pulses φSHS, φSHN for correlated double signal sampling, whereupon the CDS circuit 47 outputs the difference between the supplied signals before and after the pixel is reset from the output terminal $t_{out}$.

As a result, the output terminal $t_{out}$ of the amplification-type solid-state imaging device 31 outputs a signal from which FPN (fixed pattern noise) of the pixel and also fixed pattern noise due to a shading generated by the horizontal scanning circuit 53 have been removed.

The principles by which FPN of the pixel and also the shading generated by the horizontal scanning circuit 53 are removed will be described below.

It is assumed that a signal level of an nth pixel in the horizontal direction of an imaging device before the pixel is reset is represented by $S_n^S$, a signal level of the nth pixel after the pixel is reset is represented by $S_n^N$, a pixel signal converted from incident light applied to the pixel is represented by Sig, fixed pattern noise of the pixel is represented by FPN, the number of horizontal pixels of the imaging device is represented by N, and the amount of a horizontally linear shading in 1H (a horizontal scanning interval) is represented by $\Delta S_h$. The signal levels $S_n^N$, $S_n^S$ are expressed by:

$$S_n^N = FPN + \frac{2n-1}{2N} \Delta S_h$$

$$S_n^S = FPN + Sig + \frac{2n}{2N} \Delta S_h$$

The output signal OUT from the CDS circuit 47 is expressed by:

$$OUT = S_n^S - S_n^N = Sig + \frac{\Delta S_h}{2N}$$

A shading component other than the pixel signal converted from incident light is small as the shading is divided by 2N which is twice the number of the pixels. Because the shading is horizontally linear, the shading component represents an offset amount common in any pixel signals. Consequently, the linear shading is fully removed.

According to the above embodiment, as described above, the layout of the first signal holding circuit 51 for holding a signal before the pixel is reset, i.e., the first operation switches 37, the first load capacitance elements 38, and the first horizontal switches 39, and the layout of the second signal holding circuit 52 for holding a signal after the pixel is reset, i.e., the second operation switches 37', the second load capacitance elements 38', and the second horizontal switches 39' are vertically axially symmetrical with respect to the horizontal signal line 40 that is positioned between these layouts, and the CDS circuit 47 is connected to the output terminal of the charge detecting circuit 46 which is connected to the horizontal signal line 40. With this arrangement, the amplification-type solid-state imaging device 31 can effectively remove FPN (fixed pattern noise) generated by the pixel and also fixed pattern noise due to a shading generated by the horizontal scanning circuit 53.

In the amplification-type solid-state imaging device 1 shown in FIG. 1, the signals generated before and after the pixel is reset are outputted from the respective charge detecting circuits 16, 16', and then subtracted one from the other. The amplification-type solid-state imaging device 1 shown in FIG. 1 needs a total of three differential amplifiers, i.e., the two differential amplifiers 13 in the respective charge detecting circuits 16, 16', and the differential amplifier 17 for subtracting the signals outputted by the charge detecting circuits 16, 16' one from the other.

According to the above embodiment of the present invention, however, the amplification-type solid-state imaging device 31 requires two differential amplifiers, i.e., the differential amplifier 43 in the single charge detecting circuit 46 and the differential amplifier 58 in the CDS circuit 47. Consequently, the amplification-type solid-state imaging device 31 has a simpler circuit arrangement than the amplification-type solid-state imaging device 1.

The CDS circuit 47 is effective to remove a low-frequency component of random noise that is generated from the differential amplifier 45 and the pixel MOS transistors 32, resulting in a better signal-to-noise ratio (S/N).

In the amplification-type solid-state imaging device 1 shown in FIG. 1, gain correction is performed to equalize the gains of noise and pixel signals. According to the present embodiment, no such gain correction is needed because only one horizontal signal line 40 is employed.

Figure 8:
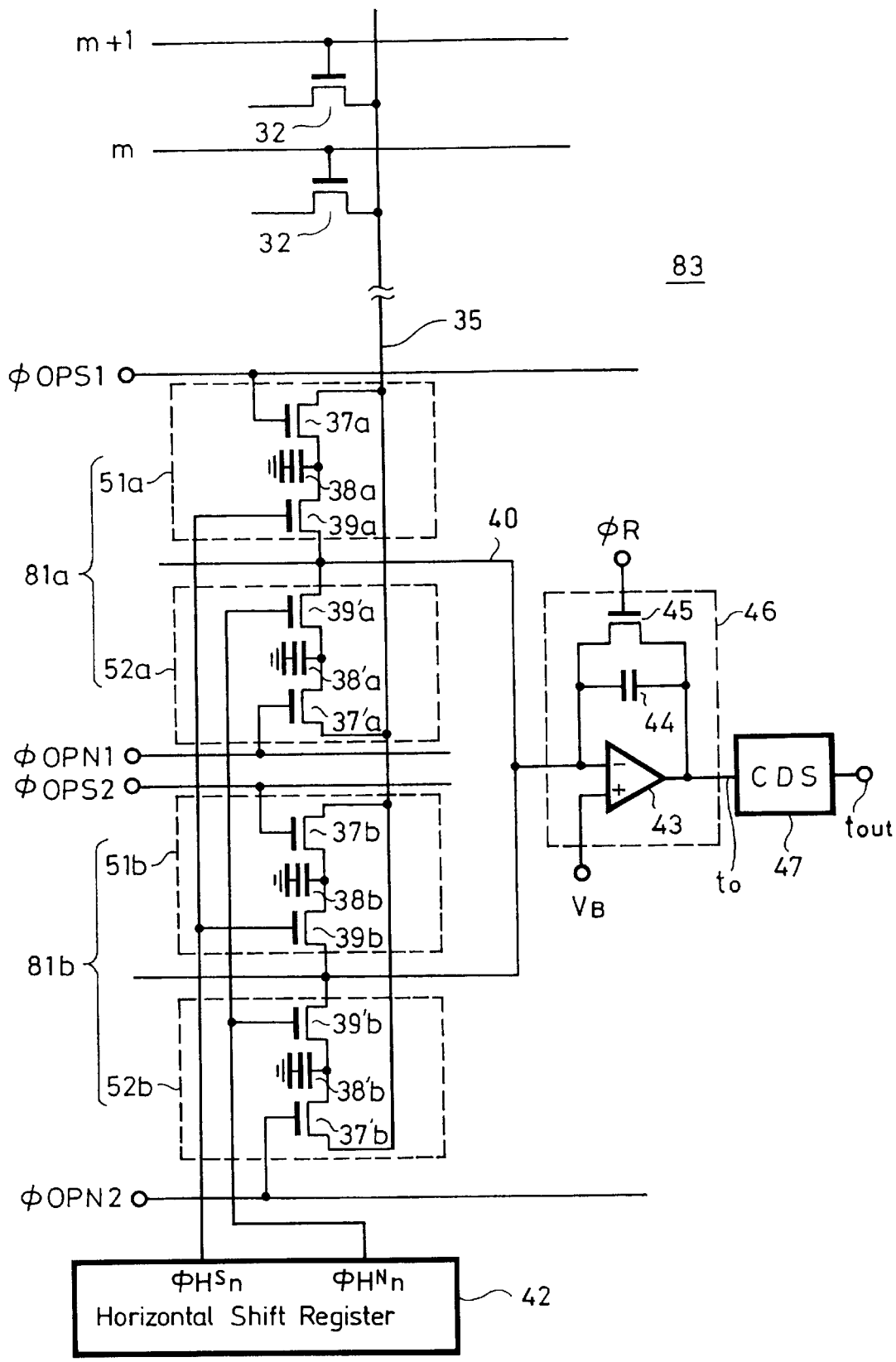
FIG. 8 is a circuit diagram, partly in block form, of an amplification-type solid-state imaging device according to a second embodiment of the present invention.

FIG. 8 shows an amplification-type solid-state imaging device 83 according to a second embodiment of the present invention. The amplification-type solid-state imaging device shown in FIG. 8 is of the field reading type.

FIG. 8 illustrates only a horizontal scanning circuit portion connected to a vertical signal line 35 of the nth column. Other structural details including pixel MOS transistors 32, a vertical scanning circuit 33, etc. are identical to those of the amplification-type solid-state imaging device 31 shown in FIG. 4, and will not be described in detail below. Those parts of the amplification-type solid-state imaging device 83 which are identical to those of the amplification-type solid-state imaging device 31 shown in FIG. 4 are denoted by identical reference numerals and representations.

As shown in FIG. 8, the horizontal scanning circuit portion connected to each vertical signal line 35 comprises two horizontal scanning circuit sections for reading a mixed signal from two vertically arranged pixels, i.e., first and second horizontal scanning circuit sections 81a, 81b connected parallel to a horizontal signal line 40, which is connected to a charge detecting circuit 46 whose output terminal is coupled to a CDS circuit 47.

Specifically, the first horizontal scanning circuit section 81a comprises a first load capacitance element 38a connected through a first operation switch 37a to the vertical signal line 35, and a first horizontal switch 39a which connects the junction between the first load capacitance element 38a and the first operation switch 37a to the horizontal signal line 40. The first horizontal scanning circuit section 81a also comprises a second load capacitance element 38'a connected through a second operation switch 37'a to the vertical signal line 35, and a second horizontal switch 39a' which connects the junction between the second load capacitance element 38'a and the second operation switch 37'a to the horizontal scanning line 40.

The first operation switch 37a, the first load capacitance element 38a, and the first horizontal switch 39a jointly make up a first signal holding circuit 51a for holding a signal produced by a pixel MOS transistor 32 of an (m+1)th row, for example, before the pixel is reset. The, second operation switch 37'a, the second load capacitance element 38'a, and the second horizontal switch 39'a jointly make up a second signal holding circuit 52a, connected parallel to the first signal holding circuit 51a, for holding a signal produced by the pixel MOS transistor 32 of the (m+1)th row, for example, after the pixel is reset.

An operation pulse $\phi OPS1$ is applied to the control electrode, i.e., the gate, of the first operation switch 37a, and an operation pulse $\phi_{OPN1}$ is applied to the control electrode, i.e., the gate, of the second operation switch 37'a.

The second horizontal scanning circuit section 81b comprises a third load capacitance element 38b connected through a third operation switch 37b to the same vertical signal line 35 as above, and a third horizontal switch 39b which connects the junction between the third load capacitance element 38b and the third operation switch 37b to the horizontal signal line 40. The second horizontal scanning circuit section 81b also comprises a fourth load capacitance element 38'b connected through a fourth operation switch 37b' to the vertical signal line 35, and a fourth horizontal switch 39'b which connects the junction between the fourth load capacitance element 38'b and the fourth operation switch 37'b to the horizontal signal line 40.

The third operation switch 37b, the third load capacitance element 38b, and the third horizontal switch 39b jointly make up a third signal holding circuit 51b for holding a signal produced by a pixel MOS transistor 32 of an mth row, for example, before the pixel is reset. The fourth operation switch 37'b, the fourth load capacitance element 38'b, and the fourth horizontal switch 39'b jointly make up a fourth signal holding circuit 52b for holding a signal produced by the pixel MOS transistor 32 of the mth row, for example, after the pixel is reset.

An operation pulse $\phi_{OPS2}$ is applied to the control electrode, i.e., the gate, of the third operation switch 37b, and an operation pulse $\phi_{OPN2}$ is applied to the control electrode, i.e., the gate, of the fourth operation switch 37'b.

The control electrodes or gates of the first and third horizontal switches 39a, 39b are connected in common to a horizontal shift register 42, which applies a common horizontal scanning pulse $\phi HS_n$ to the control electrodes or gates of the first and third horizontal switches 39a, 39b. Similarly, the control electrodes or gates of the second and fourth horizontal switches 37'a, 39'b are connected in common to the horizontal shift register 42, which applies a common horizontal scanning pulse $\phi HN_n$ to the control electrodes or gates of the second and fourth horizontal switches 39'a, 39'b.

In the amplification-type solid-state imaging device 83 of the field reading type, signals are read twice in each of former and latter halves of a horizontal blanking interval HBL.

Specifically, in the former half of the horizontal blanking interval HBL, a vertical selection pulse $\phi V_M$ is applied to select the pixel MOS transistors 32 of the mth row. The first operation switch 37a is turned off, on, and off again by the first operation pulse $\phi_{OPS1}$ to cause the first load capacitance element 38a to hold a signal transferred from a corresponding one of the pixel MOS transistors 32 of the mth row before the pixel is reset.

In a pixel resetting interval, a pixel resetting pulse $\phi V_{sub}$ is applied to the substrate to reset the signal charges stored in the pixel MOS transistors 32 of the mth row. Thereafter, the second operation switch 37'a is turned off, on, and off again by the second operation pulse $\phi_{OPN1}$ to cause the second load capacitance element 38'a to hold a signal transferred from the corresponding one of the pixel MOS transistors 32 of the mth row after the pixel is reset.

In the latter half of the horizontal blanking interval HBL, a vertical selection pulse $\phi V_{M+1}$ is applied to select the pixel MOS transistors 32 of the (m+1)th row. The third operation switch 37b is turned off, on, and off again by the third operation pulse $\phi_{OPS2}$ to cause the third load capacitance element 38b to hold a signal transferred from a corresponding one of the pixel MOS transistors 32 of the (m+1)th row before the pixel is reset.

In a next pixel resetting interval, a pixel resetting pulse $\phi V_{sub}$ is applied to the substrate to reset the signal charges stored in the pixel MOS transistors 32 of the (m+1)th row. Thereafter, the fourth operation switch 37'b is turned off, on, and off again by the fourth operation pulse $\phi_{OPN2}$ to cause the fourth load capacitance element 38'b to hold a signal transferred from the corresponding one of the pixel MOS transistors 32 of the (m+1)th row after the pixel is reset.

In a horizontal video signal interval TA, the first and third horizontal switches 39a, 39b are turned on by a horizontal scanning pulse $\phi$HS from the horizontal shift register 42 to add the two signals transferred from the pixel MOS transistors 32 of the mth and (m+1)th rows before the pixels are reset and stored in the respective first and third load capacitance elements 38a, 38b, and output the sum signal to the horizontal signal line 40. Then, the sum signal is supplied from the horizontal signal line 40 to the charge detecting circuit 46, which demodulates the sum signal into a signal voltage.

The second and fourth horizontal switches 39'a, 39'b are turned on by a horizontal scanning pulse $\phi$HN from the horizontal shift register 42 to add the two signals transferred from the pixel MOS transistors 32 of the mth and (m+1)th rows after the pixels are reset and stored in the respective second and fourth load capacitance elements 38'a, 38'b, and output the sum signal to the horizontal signal line 40. Then, the sum signal is supplied from the horizontal signal line 40 to the charge detecting circuit 46, which demodulates the sum signal into a signal voltage.

The signal voltages outputted to the output terminal $t_o$ of the charge detecting circuit 46 before and after the pixels are reset are subjected to a correlated double signal sampling process by the CDS circuit 47 for thereby removing FPN of the pixels and a shading generated by the horizontal scanning circuit in the amplification-type solid-state imaging device of the field reading type.

Figure 9:
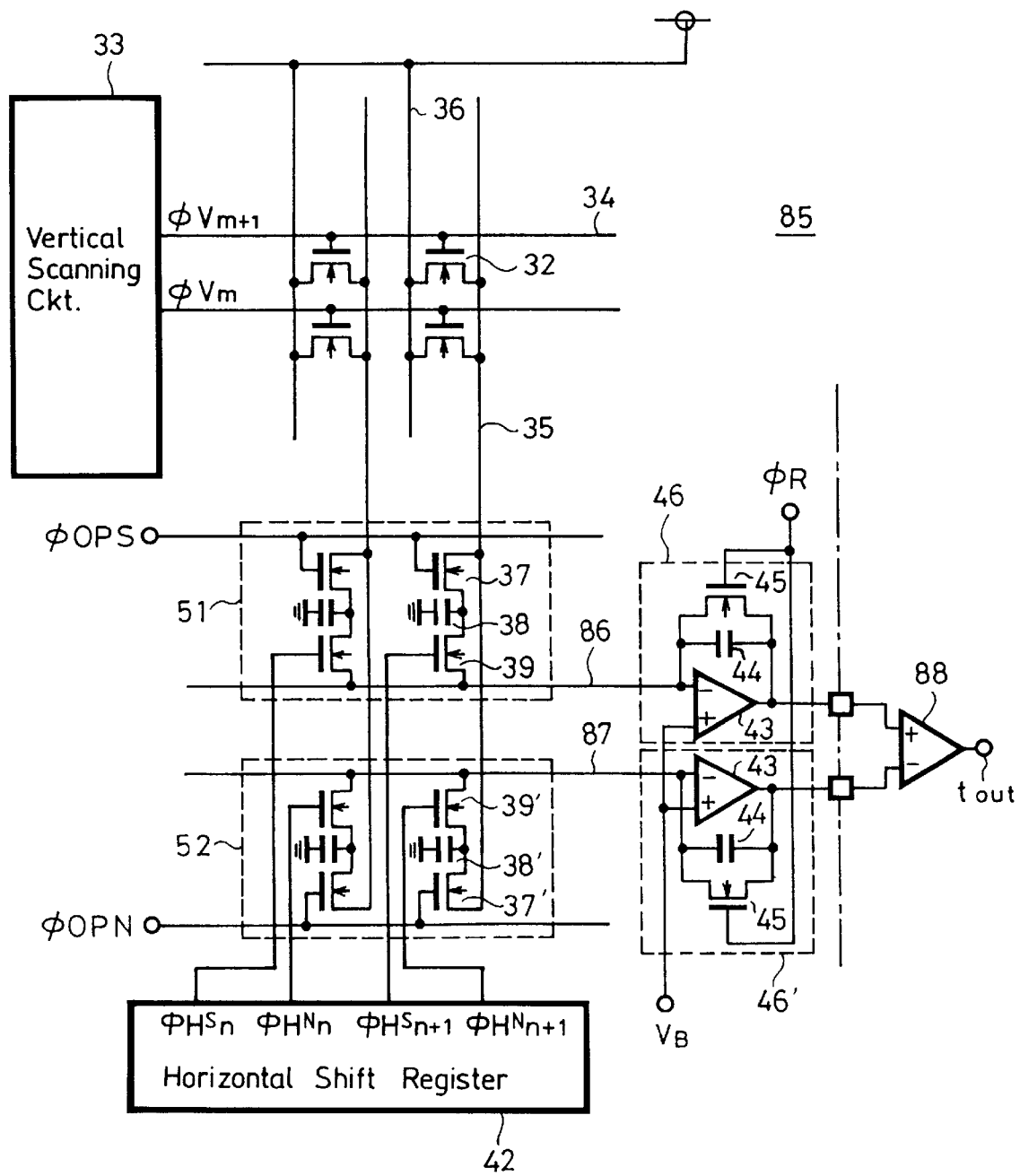
FIG. 9 is a circuit diagram, partly in block form, of an amplification-type solid-state imaging device according to a third embodiment of the present invention.

FIG. 9 illustrates an amplification-type solid-state imaging device 85 according to a third embodiment of the present invention.

As shown in FIG. 9, the amplification-type solid-state imaging device 85 has first and second signal holding circuits 51, 52 positioned axially symmetrically with respect to first and second horizontal signal lines 86, 87 disposed between the first and second signal holding circuits 51, 52. A signal produced from a pixel before the pixel is reset is held by the first signal holding circuit 51 and transferred to a charge detecting circuit 46. A signal produced from the pixel after the pixel is reset is held by the second signal holding circuit 52 and transferred to a charge detecting circuit 46'. Signal voltages produced by the charge detecting circuits 46, 46', respectively, are then subtracted one from the other.

Specifically, the first and second horizontal signal lines 86, 87 lying parallel to each other are positioned between the first and second signal holding circuits 51, 52.

The first and second signal holding circuits 51, 52 will be described below with respect to their portions associated with a vertical signal line 35. The first signal holding circuit 51 which is positioned on one side of the first and second horizontal signal lines 86, 87 comprises a first operation switch 37 connected to the vertical signal line 35, a first load capacitance element 38 connected to the first operation switch 37, and a first horizontal switch 39 connected between the first load capacitance element 38 and the first horizontal signal line 86.

The second signal holding circuit 52 which is positioned on the other side of the first and second horizontal signal lines 86, 87 in axially symmetric relation to the first signal holding circuit 51 comprises a second operation switch 37' connected to the vertical signal line 35, a second load capacitance element 38' connected to the second operation switch 37', and a second horizontal switch 39' connected between the second load capacitance element 38' and the second horizontal signal line 87.

The first horizontal signal line 86 is connected to the first charge detecting circuit 46 which comprises an operational amplifier 43, a detection capacitance element 44, and a resetting switch 45, and the second horizontal signal line 87 is connected to the second charge detecting circuit 46' which comprises an operational amplifier 43, a detection capacitance element 44, and a resetting switch 45. The first and second charge detecting circuits 46, 46' have respective output terminals connected to respective input terminals of an external subtractor 88 which comprises a differential amplifier, for example. Other details of the amplification-type solid-state imaging device 85 are identical to those of the amplification-type solid-state imaging device 31 shown in FIG. 4.

The amplification-type solid-state imaging device 85 operates as follows: A signal produced by a pixel before the pixel is reset is held by the first load capacitance element 51, and a signal produced by the pixel after the pixel is reset is held by the second load capacitance element 52. When the horizontal switches 39, 39' are turned on, the signal held in the first load capacitance element 51 is transferred through the first horizontal signal line 86 to the first charge detecting circuit 46, and the signal held in the second load capacitance element 52 is transferred through the second horizontal signal line 87 to the second charge detecting circuit 47. Signal voltages outputted from the first and second charge detecting circuits 46, 47 are subtracted one from the other by the subtractor 88, which produces an output signal from which FPN has been removed. Since the layouts of the first and second signal holding circuits 51, 52 are axially symmetric with respect to the two horizontal signal lines 86, 87 disposed therebetween, the signal voltages outputted from the first and second charge detecting circuits 46 have the same gradient of shading. Consequently, fixed pattern noise of a shading has also been removed from the output signal produced by the subtractor circuit 88.

A shading that occurs largely depends on the waveforms of operation pulses $\phi_{OPS}$, $\phi_{OPN}$ that are applied to the first and second operation switches 37, 37'. Specifically, the operation pulses $\phi_{OPS}$, $\phi_{OPN}$ are applied from an external driver circuit (not shown) through pads (terminals) along different circuit paths. Because interconnections from the external driver circuit to the first and second operation switches 37, 37' have different lengths due to layout limitations, the operation pulse $\phi_{OPS}$, for example, which passes through the longer interconnection has less sharp edges, whereas the operation pulse $\phi_{OPN}$, for example, which passes through the shorter interconnection has sharper edges. If the negative-going edge of the operation pulse $\phi_{OPS}$ for turning off the first operation switch 37 is less sharp, then the gradient of a shading is smaller. If the negative-going edge of the operation pulse $\phi_{OPN}$ for turning off the second operation switch 37' is sharper, then the gradient of a shading is greater. The same is true for the waveforms of the horizontal scanning pulses $\phi$HS, $\phi$HN.

Figure 10:
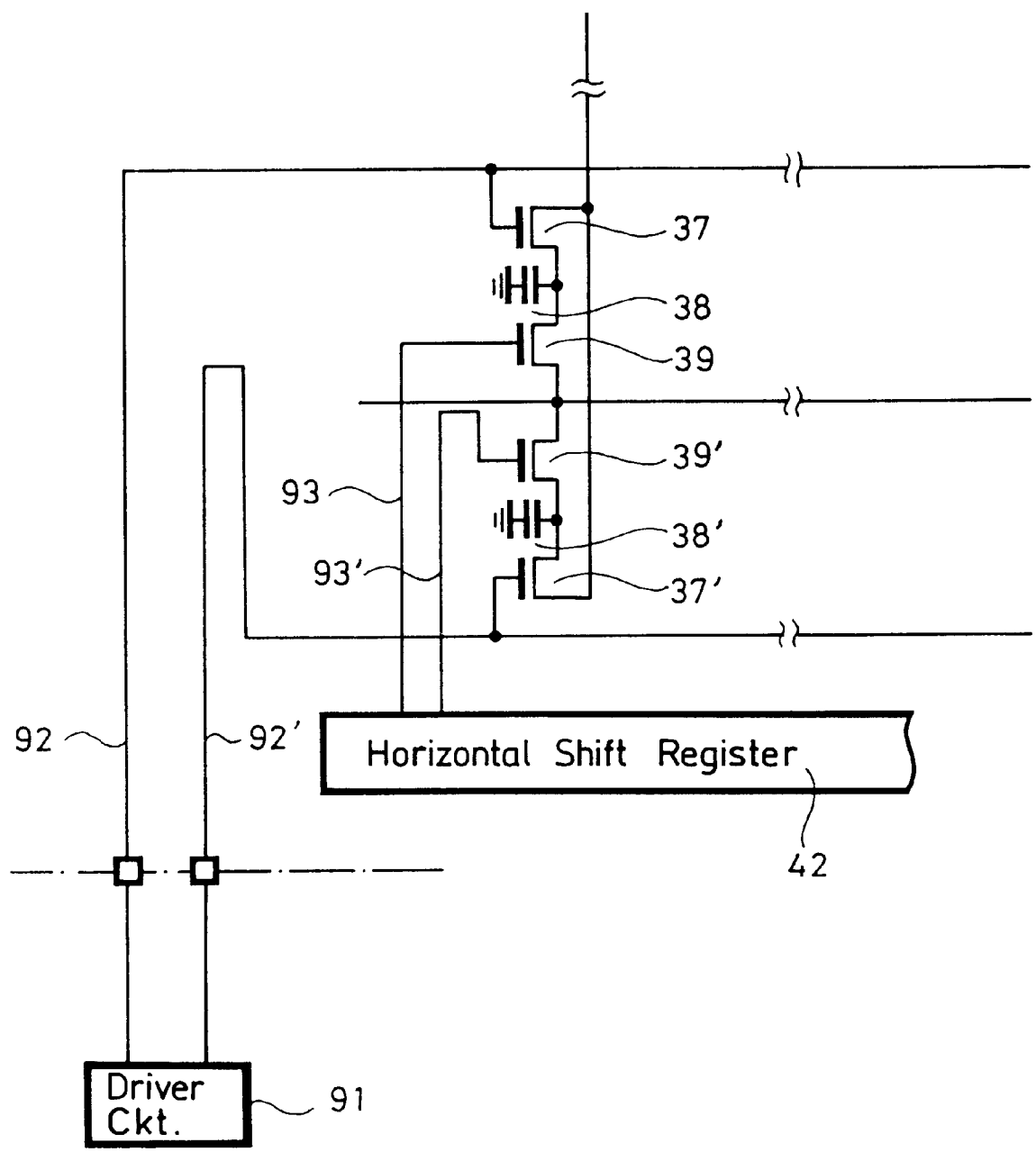
FIG. 10 is a circuit diagram, partly in block form, of an amplification-type solid-state imaging device according to a fourth embodiment of the present invention.

FIG. 10 shows an amplification-type solid-state imaging device according to a fourth embodiment of the present invention, which is designed to eliminate the above problem of the amplification-type solid-state imaging device 85 shown in FIG. 9. FIG. 10 shows only a portion of a horizontal scanning circuit.

As shown in FIG. 10, a driver circuit 91, such as an external CMOS inverter or the like, for supplying operation pulses $\phi_{OPS}$, $\phi_{OPN}$ is connected to first and second operation switches 37, 37' by respective interconnections 92, 92' which have the same length as each other. A horizontal shift register 42 is connected to horizontal switches 39, 39' by respective respective interconnections 93, 93' which have the same length as each other.

Other details of the amplification-type solid-state imaging device shown in FIG. 10 are identical to those of the amplification-type solid-state imaging device 31 shown in FIG. 4.

While the driver circuit 91 is shown as an external driver circuit in FIG. 10, it may be of an on-chip circuit disposed on the chip of the amplification-type solid-state imaging device.

Since the interconnections 92, 92' from the driver circuit 91 to the first and second operation switches 37, 37' have the same length as each other, the waveforms of the operation pulses $\phi_{OPS}$, $\phi_{OPN}$ supplied to the first and second operation switches 37, 37' are identical to each other as much as possible for reducing a shading.

Furthermore, since the interconnections 93, 93' from the horizontal shift register 42 to the horizontal switches 39, 39' have the same length as each other, the waveforms of horizontal scanning pulses applied to the horizontal switches 39, 39' are identical to each other as much as possible for reducing a shading.

In the above embodiments, each of the pixel MOS transistors 32 has a pixel structure of n-channel MOS transistor. However, each of the pixel MOS transistors 32 may have a pixel structure of p-channel MOS transistor by inverting the impurity conductivity type.

Figure 11:
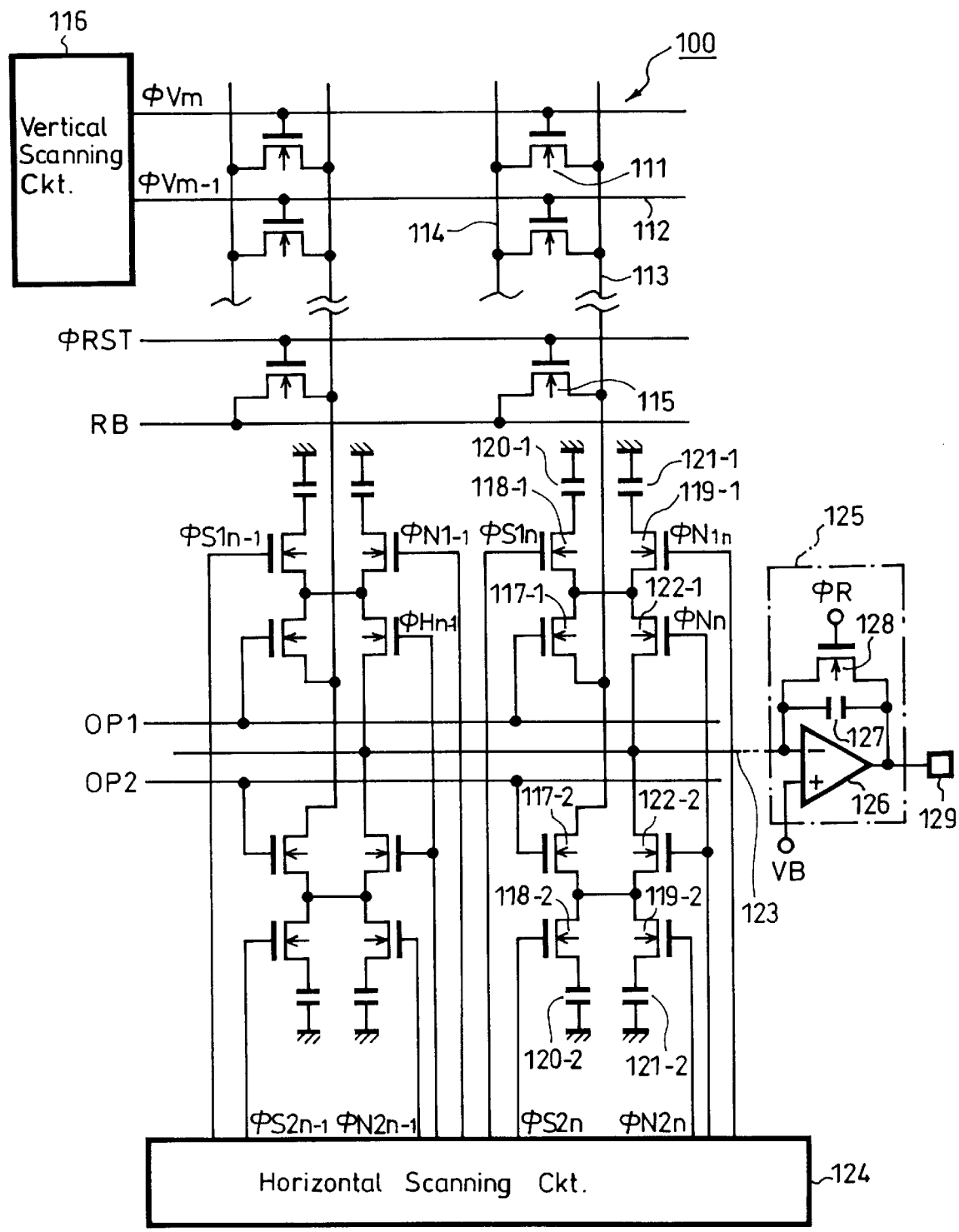
FIG. 11 is a circuit diagram, partly in block form, of an amplification-type solid-state imaging device according to a fifth embodiment of the present invention.

FIG. 11 shows an amplification-type solid-state imaging device according to a fifth embodiment of the present invention. The amplification-type solid-state imaging device according to the fifth embodiment is of the interlaced type.

As shown in FIG. 11, the amplification-type solid-state imaging device has a pixel area 110 comprising a matrix of pixel transistors 111 arranged in rows and columns, the pixel transistors 111 comprising NMOS transistors in the illustrated embodiment. The pixel transistors 111 in the rows have respective gates connected to vertical selection lines 112, and the pixel transistors 111 in the columns have respective sources connected to vertical signal lines 113. A predetermined voltage is applied through power supply lines 114 to the drains of the pixel transistors 111 in the columns. Resetting NMOS transistors 115 are connected between a resetting voltage RB and the vertical signal lines 113. The resetting NMOS transistors 115 have respective gates to which a resetting pulse $\phi$RST is applied.

The vertical selection lines 112 are connected to respective output terminals of a vertical scanning circuit 116 which correspond to the respective rows of the pixel area 100. The vertical scanning circuit 116 comprises a shift register or the like, and applies vertical selection pulses $\phi$Vi ( ..., $\phi V_{m-1}$, $\phi$Vm, ... ) to the respective vertical selection lines 112 for vertically scanning the pixel area 100 to read pixel information successively from the rows of the pixel transistors 111. Each of the vertical signal lines 113 is connected to drains of NMOS transistors 117-1, 117-2 which function as common operation switches. The NMOS transistors 117-1, 117-2 have gates to which operation pulses $\phi$OP1, $\phi$OP2 are applied.

The NMOS transistor 117-1 has a source connected to the drains of respective two NMOS transistors 118-1, 1191 which function as signal and noise operation switches, respectively. The NMOS transistors 118-1, 119-1 are of the same size as each other. The NMOS transistor 118-1 has a gate to which a signal operation pulse $\phi$S1i ( ..., $\phi$S1n-1, $\phi$S1n, ... ) is applied, and the NMOS transistor 119-1 has a gate to which a signal operation pulse $\phi$N1i ( ..., $\phi$N1n-1, $\phi$N1n, ... ) is applied.

Similarly, the NMOS transistor 117-2 has a source connected to the drains of respective two NMOS transistors 118-2, 119-2 which function as signal and noise operation switches, respectively. The NMOS transistors 118-2, 119-2 are of the same size as each other. The NMOS transistor 118-2 has a gate to which a signal operation pulse $\phi$S2i ( ..., $\phi$S2n-1, $\phi$S2n, ... ) is applied, and the NMOS transistor 119-1 has a gate to which a signal operation pulse $\phi$N2i ( ..., $\phi$N2n-1, $\phi$N2n, ... ) is applied. The signal operation pulses $\phi$S1i, $\phi$S2i and the noise operation pulses $\phi$N1i, $\phi$N2i are generated by a horizontal scanning circuit 124 described later on.

The NMOS transistors 118-1, 119-1 have respective sources connected to ends of two capacitors 120-1, 121-1, respectively, whose other ends are grounded. Similarly, the NMOS transistors 118-2, 119-2 have respective sources connected to ends of two capacitors 120-2, 121-2, respectively, whose other ends are grounded. The sources of the NMOS transistors 117-1, 117-2 are connected to the respective drains of NMOS transistors 122-1, 122-2 which function as horizontal switches. The NMOS transistors 122-1, 122-2 have respective sources connected to a horizontal signal line 123 and respective gates connected to an output terminal of the horizontal scanning circuit 124.

The horizontal scanning circuit 124 scans the pixel area 100 horizontally and generates the signal operation pulses $\phi$S1i, $\phi$S2i and the noise operation pulses $\phi$N1i, $\phi$N2i for each of the columns of the pixel transistors 111. The horizontal scanning circuit 124 applies the signal operation pulses $\phi$S1i, $\phi$S2i and the noise operation pulses $\phi$N1i, $\phi$N2i to the respective gates of the NMOS transistors 118-1, 118-2 and the NMOS transistors 119-1, 119-2. The horizontal scanning circuit 124 also generates horizontal scanning pulses $\phi$Hi ( ..., $\phi$Hn-1, $\phi$Hn, ... ) for reading charges held in the capacitors 120-1, 120-2 and charges held in the capacitors 121-1, 121-2, and applies the horizontal scanning pulses $\phi$Hi ( ..., $\phi$Hn-1, $\phi$Hn, ... ) to the gates of the NMOS transistors 122-1, 122-2. A specific circuit arrangement of the horizontal scanning circuit 124 will be described later on.

The horizontal scanning line 123 is connected to an inverting input terminal (−) of a differential amplifier 126 of an output circuit 125. The differential amplifier 126 has a noninverting input terminal (+) to which a bias voltage VB for determining an operation potential of the horizontal signal line 123 is applied. The output circuit 125 includes the differential amplifier 126, a capacitor 127 connected between the inverting input terminal and output terminal of the differential amplifier 126, and an NMOS transistor 128 connected parallel to the capacitor 127. The NMOS transistor 128 has a gate to which a resetting pulse φR is applied.

Figure 12:
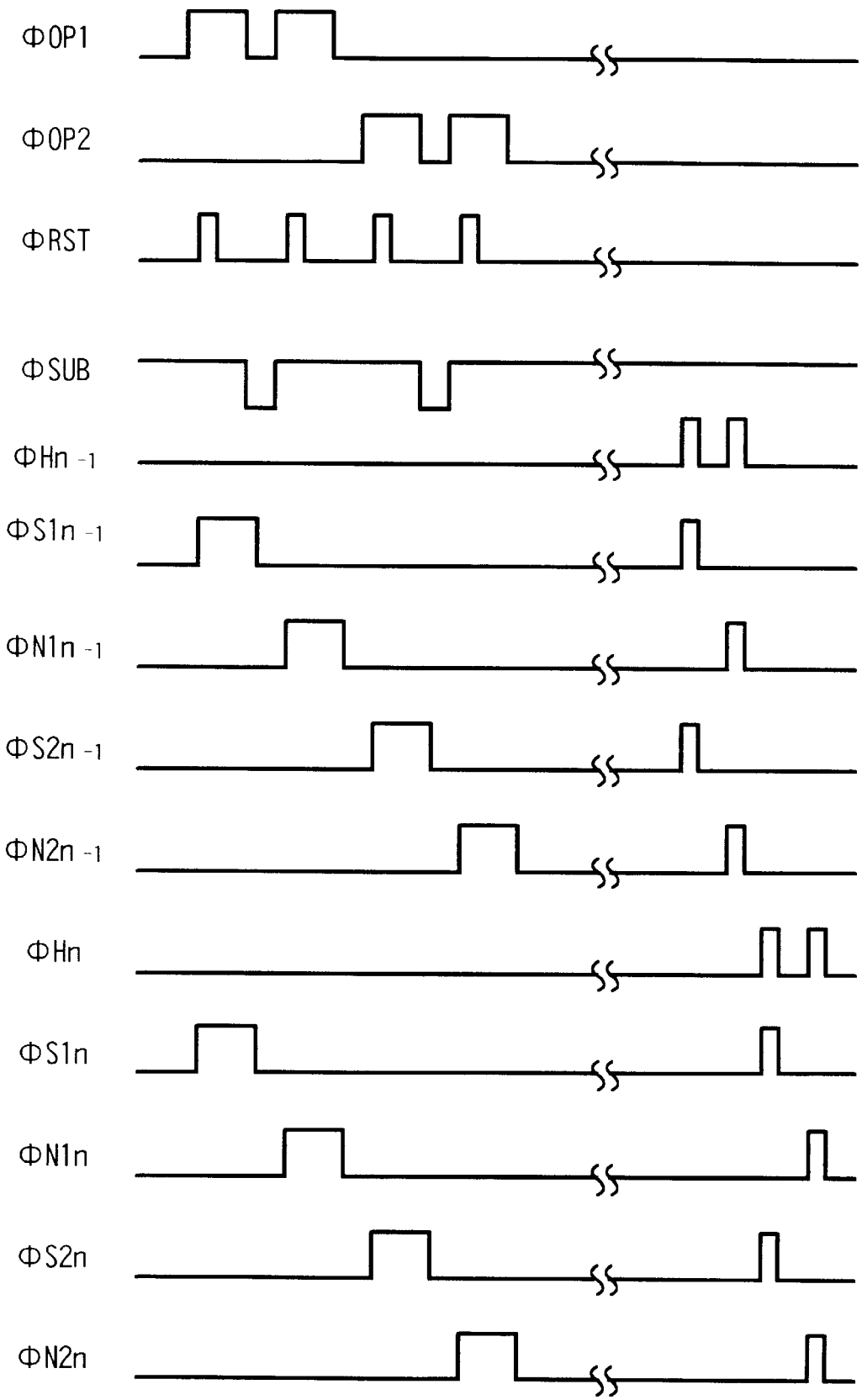
FIG. 12 is a timing chart showing signal waveforms illustrative of the manner in which the amplification-type solid-state imaging device according to the fifth embodiment operates.

A process of operation of the amplification-type solid-state imaging device according to the fifth embodiment in an interlaced mode for reading the sum of signals from two vertically adjacent lines, i.e., the sum of signals from (m−1)th and mth rows, for example, of pixel transistors 111 will be described below with reference to FIG. 12.

When the operation pulse φOP1 becomes "H" in level and the resetting pulse ORST and the signal operation pulse φS1$i$ become "H" in level while the operation pulse φOP1 is "H" in level, the NMOS transistor 117-1 is turned on and then the NMOS transistors 115, 118-1 are turned on. The resetting voltage RB is applied through the NMOS transistor 115 to the vertical signal line 113, and then through the vertical signal line 113 and the NMOS transistors 117-1, 118-1 to the capacitor 120-1, thereby resetting the vertical signal line 113 and the capacitor 120-1.

Thereafter, when the resetting pulse ORST becomes "L" in level, turning off the NMOS transistor 115, a signal depending on incident light applied to the pixel transistor 111 of the (m−1)th row is read from the pixel transistor 111 through the NMOS transistors 117-1, 118-1 and stored in the capacitor 120-1. The stored signal contains noise due to a characteristic variation of the pixel transistor 111.

After the operation pulse φOP1 becomes "L" in level, a substrate pulse φSUB which is "L" in level is applied to the substrate of the amplification-type solid-state imaging device for thereby resetting the pixel transistors 111 in the (m−1)th row which has been selected by the vertical scanning circuit 116. After the pixel transistors 111 are reset, the operation pulse φOP1 becomes "H" in level again. When the resetting pulse φRST and the noise operation pulse φN1$i$ become "H" in level while the operation pulse φOP1 is "H" in level, the NMOS transistor 117-1 is turned on and then the NMOS transistors 115, 119-1 are turned on.

The resetting voltage RB is applied through the NMOS transistor 115 to the vertical signal line 113, and then through the vertical signal line 113 and the NMOS transistors 117-1, 119-1 to the capacitor 121-1, thereby resetting the vertical signal line 113 and the capacitor 121-1. Thereafter, when the resetting pulse φRST becomes "L" in level, turning off the NMOS transistor 115, a noise from the pixel transistor 111 of the (m−1)th row is read from the pixel transistor 111 through the NMOS transistors 117-1, 119-1 and stored in the capacitor 121-1.

When the operation pulse φOP2 becomes "H" in level and the resetting pulse φRST and the signal operation pulse φS2$i$ become "H" in level while the operation pulse φOP2 is "H" in level, the NMOS transistor 117-2 is turned on and then the NMOS transistors 115, 118-2 are turned on. The resetting voltage RB is applied through the NMOS transistor 115 to the vertical signal line 113, and then through the vertical signal line 113 and the NMOS transistors 117-2, 118-2 to the capacitor 120-2, thereby resetting the vertical signal line 113 and the capacitor 120-2.

Thereafter, when the resetting pulse φRST becomes "L" in level, turning off the NMOS transistor 115, a signal depending on incident light applied to the pixel transistor 111 of the mth row is read from the pixel transistor 111 through the NMOS transistors 117-2, 118-2 and stored in the capacitor 120-2. The stored signal contains a noise due to a characteristic variation of the pixel transistor 111.

After the operation pulse φOP2 becomes "L" in level, a substrate pulse φSUB which is "L" in level is applied to the substrate of the amplification-type solid-state imaging device for thereby resetting the pixel transistors 111 in the mth row which has been selected by the vertical scanning circuit 116. After the pixel transistors 111 are reset, the operation pulse φOP2 becomes "H" in level again. When the resetting pulse φRST and the noise operation pulse φN2$i$ become "H" in level while the operation pulse φOP2 is "H" in level, the NMOS transistor 117-2 is turned on and then the NMOS transistors 115, 119-2 are turned on.

The resetting voltage RB is applied through the NMOS transistor 115 to the vertical signal line 113, and then through the vertical signal line 113 and the NMOS transistors 117-2, 119-2 to the capacitor 121-2, thereby resetting the vertical signal line 113 and the capacitor 121-2. Thereafter, when the resetting pulse φRST becomes "L" in level, turning off the NMOS transistor 115, a noise from the pixel transistor 111 of the mth row is read from the pixel transistor 111 through the NMOS transistors 117-2, 119-2 and stored in the capacitor 121-2.

After the signal and noises for one line in one field have been read, a horizontal scanning pulse φHn of the nth column, for example, and signal operation pulses φS1$n$, φS2$n$ become "H" in level, turning on the NMOS transistors 122-1, 122-2 and the NMOS transistors 118-1, 118-2. The signals stored in the capacitors 120-1, 120-2 are read to the horizontal signal line 123, and added to each other on the horizontal signal line 123. A sum signal is supplied from the horizontal signal line 123 to the output circuit 125.

After the horizontal scanning pulse φHn and the signal operation pulses φS1$n$, φS2$n$ become "L" in level, the resetting pulse φR becomes "H" in level, turning on the NMOS transistor 128 of the output circuit 125 thereby to reset the capacitor 127. After the resetting pulse φR becomes "L" in level, turning off the NMOS transistor 128, the horizontal scanning pulse φHn of the nth column become "H" in level again, and simultaneously the noise operation pulses φN1$n$, φN2$n$ become "H" in level.

When the NMOS transistors 122-1, 122-2 and the NMOS transistors 119-1, 119-2 are turned on, noises are from the capacitors 121-1, 121-2 through the NMOS transistors 119-1, 119-2 and the NMOS transistors 122-1, 122-2 to the horizontal signal line 123 and added to each other on the horizontal signal line 123. A sum noise is then supplied from the horizontal signal line 123 to the output circuit 125. The above cycle of operations is repeated to output the signals and noises successively from an output terminal 129 to an external signal processor (not shown).

In the external signal processor, the signals and noises are subjected to a correlated double signal sampling process to deduct the noises from the signals, thus removing fixed pattern noise (FPN). In this embodiment, the horizontal scanning circuit 124 is common to the signals and noises, and the signals and noises are read through the same signal reading system. Therefore, the amplification-type solid-state imaging device is capable of removing not only fixed pattern noise due to characteristic variations of the pixel transistors 111, but also fixed pattern noise resulting from characteristic variations of elements of the signal reading system which include the NMOS transistors 122-1, 122-2 as horizontal switches and also elements of the horizontal scanning circuit 124.

Figure 13:
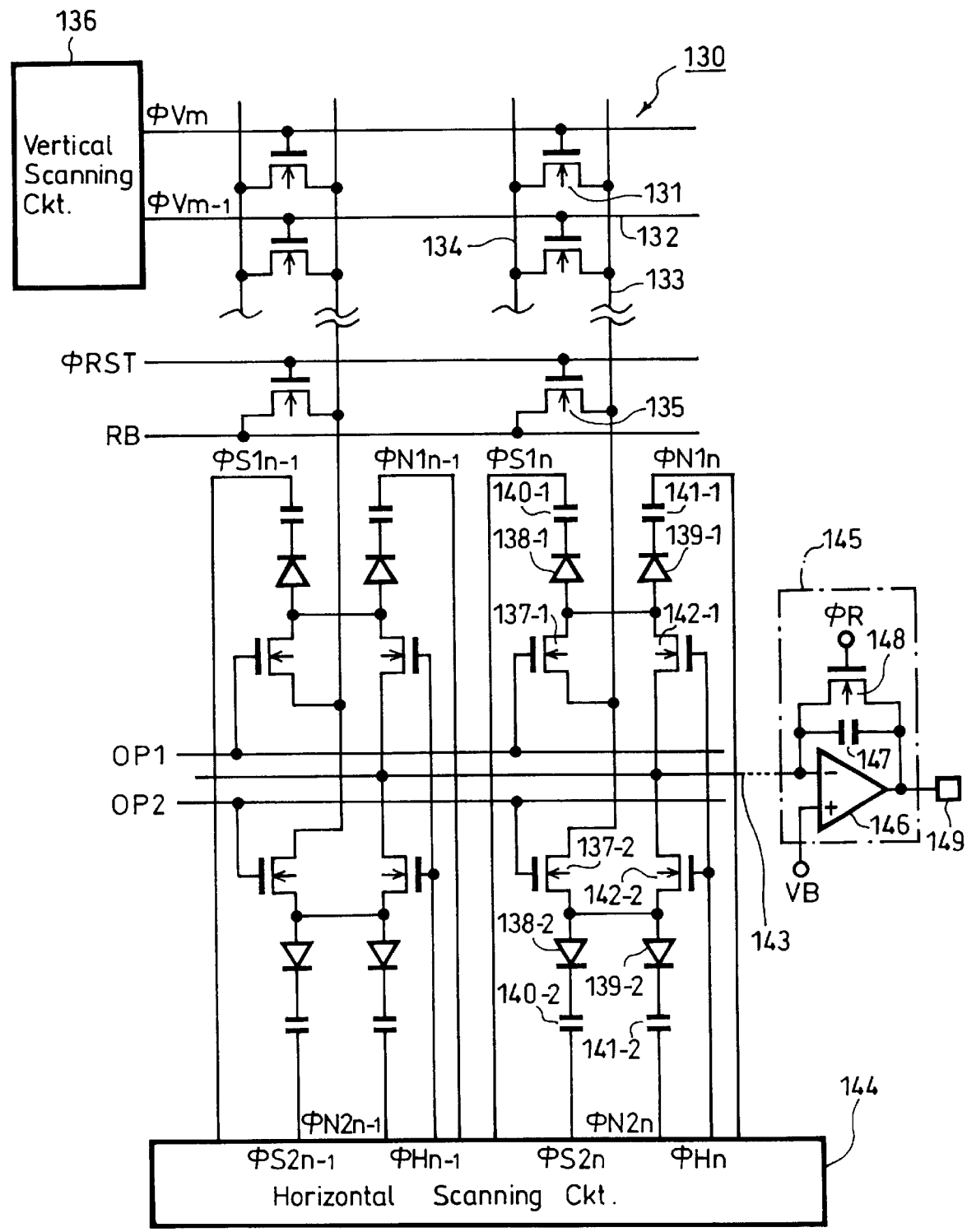
FIG. 13 is a circuit diagram, partly in block form, of an amplification-type solid-state imaging device according to a sixth embodiment of the present invention.

FIG. 13 shows an amplification-type solid-state imaging device according to a sixth embodiment of the present invention. The amplification-type solid-state imaging device according to the sixth embodiment is of the interlaced type.

As shown in FIG. 13, the amplification-type solid-state imaging device has a pixel area 130 comprising a matrix of pixel transistors 131 arranged in rows and columns, the pixel transistors 131 comprising NMOS transistors in the illustrated embodiment. The pixel transistors 131 in the rows have respective gates connected to vertical selection lines 132, and the pixel transistors 131 in the columns have respective sources connected to vertical signal lines 133. A predetermined voltage is applied through power supply lines 134 to the drains of the pixel transistors 131 in the columns. Resetting NMOS transistors 135 are connected between a resetting voltage RB and the vertical signal lines 133. The resetting NMOS transistors 135 have respective gates to which a resetting pulse φRST is applied.

The vertical selection lines 132 are connected to respective output terminals of a vertical scanning circuit 136 which correspond to the respective rows of the pixel area 130. The vertical scanning circuit 136 comprises a shift register or the like, and applies vertical selection pulses φVi ( . . . , φVm−1, φVm, . . . ) to the respective vertical selection lines 132 for vertically scanning the pixel area 130 to read pixel information successively from the rows of the pixel transistors 131. Each of the vertical signal lines 133 is connected to drains of NMOS transistors 137-1, 137-2 which function as common operation switches. The NMOS transistors 137-1, 137-2 have gates to which operation pulses φOP1, φOP2 are applied.

The NMOS transistor 137-1 has a source connected to the anodes of respective two diodes 138-1, 139-1 which function as signal and noise operation switches, respectively. The diodes 138-1, 139-1 have respective cathodes connected to ends of respective capacitors 140-1, 141-1. A signal operation pulse φS1i ( . . . , φS1n−1, φS1n, . . . ) is applied to the other end of capacitor 140-1, and a signal operation pulse φN1i ( . . . , φN1n−1, φN1n, . . . ) is applied to the other end of capacitor 141-1.

Similarly, the NMOS transistor 137-2 has a source connected to the anodes of respective two diodes 138-2, 139-2 which function as signal and noise operation switches, respectively. The diodes 138-2, 139-2 have respective cathodes connected to ends of respective capacitors 140-2, 141-2. A signal operation pulse φS2i ( . . . , φS2n−1, φS2n, . . . ) is applied to the other end of capacitor 140-2, and a signal operation pulse φN2i ( . . . , φN2n−1, φN2n, . . . ) is applied to the other end of capacitor 141-2.

The signal operation pulses φS1i, φS2i and the noise operation pulses φN1i, φN2i are generated by a horizontal scanning circuit 144 described later on. The sources of the NMOS transistors 137-1, 137-2 are connected to the respective sources of NMOS transistors 142-1, 142-2 which function as horizontal switches. The NMOS transistors 142-1, 142-2 have respective drains connected to a horizontal signal line 143 and respective gates connected to an output terminal of the horizontal scanning circuit 144.

The horizontal scanning circuit 144 scans the pixel area 130 horizontally and generates the signal operation pulses φS1i, φS2i and the noise operation pulses φN1i, φN2i for each of the columns of the pixel transistors 131. The horizontal scanning circuit 144 applies the signal operation pulses φS1i, φS2i and the noise operation pulses φN1i, φN2i to the other ends of the capacitors 140-1, 140-2 an the capacitors 141-1, 141-2. The horizontal scanning circuit 144 also generates horizontal scanning pulses φHi ( . . . , φHn−1, φHn, . . . ) for reading charges held in the capacitors 140-1, 140-2 and charges held in the capacitors 141-1, 141-2, and applies the horizontal scanning pulses φHi ( . . . , φHn−1, φHn, . . . ) to the gates of the NMOS transistors 142-1, 142-2.

A specific circuit arrangement of the horizontal scanning circuit 144 will be described later on.

The horizontal scanning line 143 is connected to an inverting input terminal (−) of a differential amplifier 146 of an output circuit 145. The differential amplifier 146 has a noninverting input terminal (+) to which a bias voltage VB for determining an operation potential of the horizontal signal line 143 is applied. The output circuit 145 includes the differential amplifier 146, a capacitor 147 connected between the inverting input terminal and output terminal of the differential amplifier 146, and an NMOS transistor 148 connected parallel to the capacitor 147. The NMOS transistor 148 has a gate to which a resetting pulse φR is applied.

Figure 14:
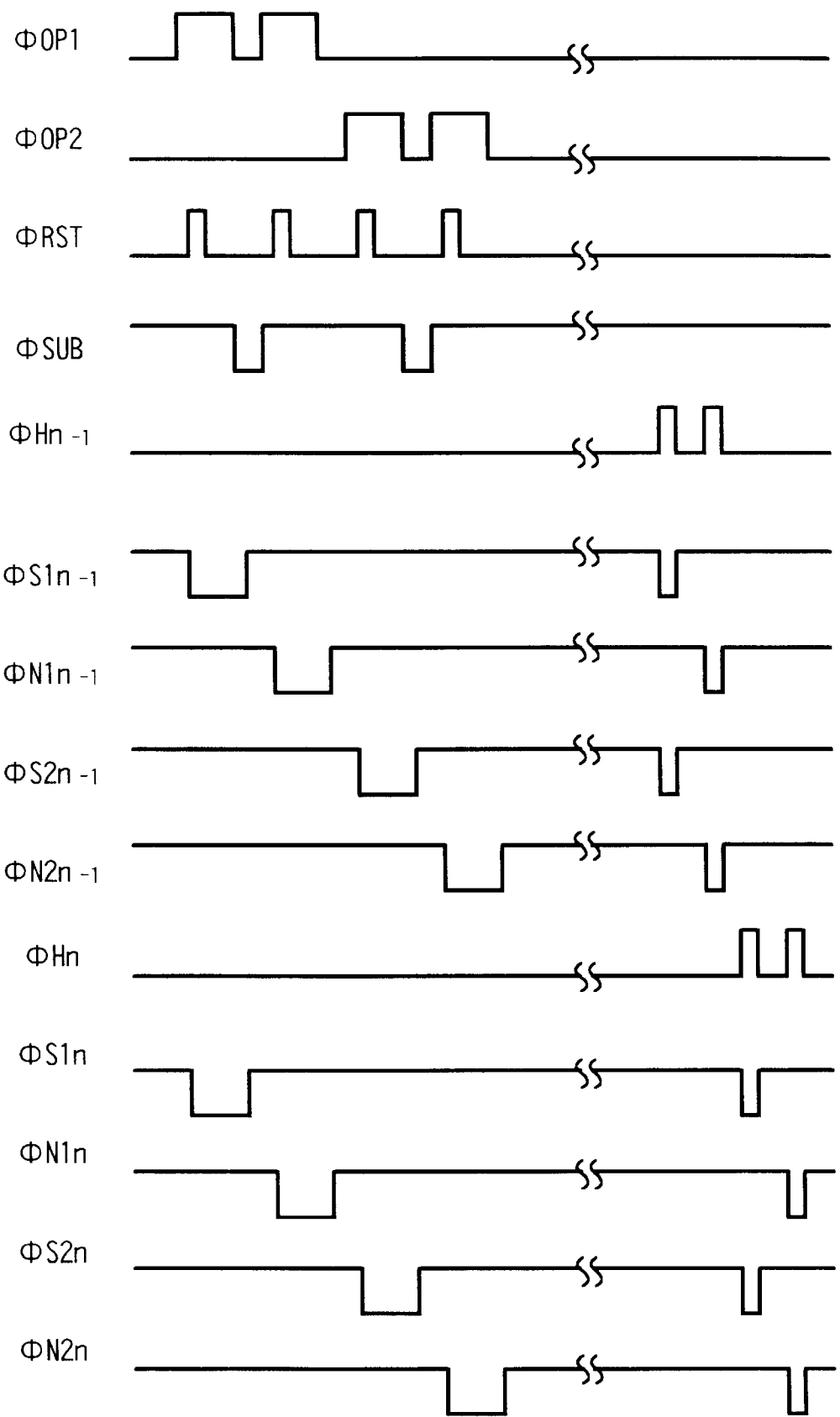
FIG. 14 is a timing chart showing signal waveforms illustrative of the manner in which the amplification-type solid-state imaging device according to the sixth embodiment operates.

A process of operation of the amplification-type solid-state imaging device according to the sixth embodiment in an interlaced mode for reading the sum of signals from two vertically adjacent lines, i.e., the sum of signals from (m−1) th and mth rows, for example, of pixel transistors 131 will be described below with reference to FIG. 14.

When the operation pulse φOP1 becomes "H" in level and the resetting pulse φRST and the signal operation pulse φS1i become "H" in level while the operation pulse φOP1 is "H" in level, the NMOS transistor 137-1 is turned on and then the NMOS transistor 135 and the diode 138-1 are turned on. The resetting voltage RB is applied through the NMOS transistor 135 to the vertical signal line 133, and then through the vertical signal line 133 and the NMOS transistor 137-1 and the diode 138-1 to the capacitor 140-1, thereby resetting the vertical signal line 133 and the capacitor 140-1.

Thereafter, when the resetting pulse φRST becomes "L" in level, turning off the NMOS transistor 135, a signal depending on incident light applied to the pixel transistor 131 of the (m−1)th row is read from the pixel transistor 131 through the NMOS transistor 137-1 and the diode 138-1 and stored in the capacitor 140-1. The stored signal contains noise due to a characteristic variation of the pixel transistor 131.

After the operation pulse φOP1 becomes "L" in level, a substrate pulse φSUB which is "L" in level is applied to the substrate of the amplification-type solid-state imaging device for thereby resetting the pixel transistors 131 in the (m−1)th row which has been selected by the vertical scanning circuit 136. After the pixel transistors 131 are reset, the operation pulse φOP1 becomes "H" in level again. When the resetting pulse φRST and the noise operation pulse φN1i become "H" in level while the operation pulse φOP1 is "H" in level, the NMOS transistor 137-1 is turned on and then the NMOS transistor 135 and the diode 139-1 are turned on.

The resetting voltage RB is applied through the NMOS transistor 135 to the vertical signal line 133, and then through the vertical signal line 133 and the NMOS transistor 137-1 and the diode 139-1 to the capacitor 141-1, thereby resetting the vertical signal line 133 and the capacitor 141-1. Thereafter, when the resetting pulse φRST becomes "L" in level, turning off the NMOS transistor 135, a noise from the pixel transistor 131 of the (m−1)th row is read from the pixel transistor 131 through the NMOS transistor 137-1 and the diode 139-1 and stored in the capacitor 141-1.

When the operation pulse φOP2 becomes "H" in level and the resetting pulse φRST and the signal operation pulse φS2i become "H" in level while the operation pulse φOP2 is "H" in level, the NMOS transistor 137-2 is turned on and then the NMOS transistor 135 and the diode 138-2 are turned on. The resetting voltage RB is applied through the NMOS transistor 135 to the vertical signal line 133, and then through the vertical signal line 133 and the NMOS transistor 137-2 and the diode 138-2 to the capacitor 140-2, thereby resetting the vertical signal line 133 and the capacitor 140-2.

Thereafter, when the resetting pulse φRST becomes "L" in level, turning off the NMOS transistor 135, a signal depending on incident light applied to the pixel transistor 131 of the mth row is read from the pixel transistor 131 through the NMOS transistor 137-2 and the diode 138-2 and stored in the capacitor 140-2. The stored signal contains noise due to a characteristic variation of the pixel transistor 131.

After the operation pulse φOP2 becomes "L" in level, a substrate pulse φSUB which is "L" in level is applied to the substrate of the amplification-type solid-state imaging device for thereby resetting the pixel transistors 131 in the mth row which has been selected by the vertical scanning circuit 136. After the pixel transistors 131 are reset, the operation pulse φOP2 becomes "H" in level again. When the resetting pulse φRST and the noise operation pulse φN2$i$ become "H" in level while the operation pulse φOP2 is "H" in level, the NMOS transistor 137-2 is turned on and then the NMOS transistor 135 and the diode 139-2 are turned on.

The resetting voltage RB is applied through the NMOS transistor 135 to the vertical signal line 133, and then through the vertical signal line 133 and the NMOS transistor 137-2 and the diode 139-2 to the capacitor 141-2, thereby resetting the vertical signal line 133 and the capacitor 141-2. Thereafter, when the resetting pulse φRST becomes "L" in level, turning off the NMOS transistor 135, a noise from the pixel transistor 131 of the mth row is read from the pixel transistor 131 through the NMOS transistor 137-2 and the diode 139-2 and stored in the capacitor 141-2.

After the signal and noises for one line in one field have been read, a horizontal scanning pulse φHn of the nth column, for example, and signal operation pulses φS1n, φS2n become "H" in level, turning on the NMOS transistors 142-1, 142-2 and the diodes 138-1, 138-2. The signals stored in the capacitors 140-1, 140-2 are read to the horizontal signal line 143, and added to each other on the horizontal signal line 143. A sum signal is supplied from the horizontal signal line 143 to the output circuit 145.

After the horizontal scanning pulse φHn and the signal operation pulses φS1n, φS2n become "L" in level, the resetting pulse φR becomes "H" in level, turning on the NMOS transistor 148 of the output circuit 145 thereby to reset the capacitor 147. After the resetting pulse φR becomes "L" in level, turning off the NMOS transistor 148, the horizontal scanning pulse φHn of the nth column become "H" in level again, and simultaneously the noise operation pulses φN1n, φN2n become "H" in level.

When the NMOS transistors 142-1, 142-2 and the NMOS transistors 139-1, 139-2 are turned on, noises are from the capacitors 141-1, 141-2 through the NMOS transistors 139-1, 139-2 and the NMOS transistors 142-1, 142-2 to the horizontal signal line 143 and added to each other on the horizontal signal line 143. A sum noise is then supplied from the horizontal signal line 143 to the output circuit 145. The above cycle of operations is repeated to output the signals and noises successively from an output terminal 149 to an external signal processor (not shown).

In the external signal processor, the signals and noises are subjected to a correlated double signal sampling process to deduct the noises from the signals, thus removing fixed pattern noise (FPN). In this embodiment, the horizontal scanning circuit 144 is common to the signals and noises, and the signals and noises are read through the same signal reading system. Therefore, the amplification-type solid-state imaging device is capable of removing not only fixed pattern noise due to characteristic variations of the pixel transistors 131, but also fixed pattern noise resulting from characteristic variations of elements of the signal reading system which include the NMOS transistors 142-1, 142-2 as horizontal switches and also elements of the horizontal scanning circuit 144.

The amplification-type solid-state imaging devices according to the fifth and sixth embodiments require five types of pulses, i.e., the operation pulse φHi, the signal operation pulses φS1$i$, φS2$i$, and the noise operation pulses φN1$i$, φN2$i$. These pulses are generated by the horizontal scanning circuits 124, 144. A circuit arrangement for use as the horizontal scanning circuit 124 is shown in FIG. 15.

Figure 15:
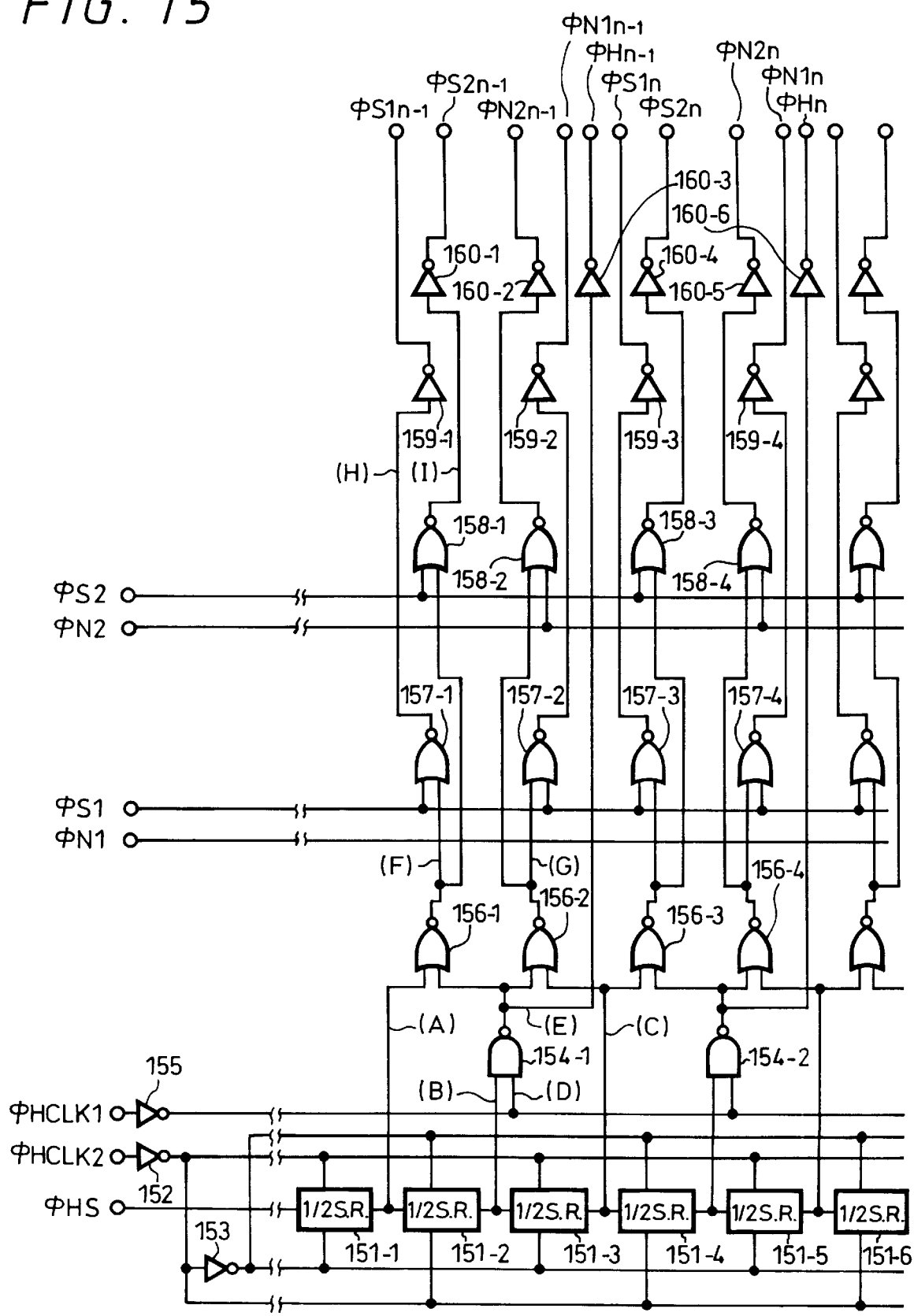
FIG. 15 is a block diagram of a horizontal scanning circuit in the amplification-type solid-state imaging device according to the fifth embodiment.

The horizontal scanning circuit shown in FIG. 15 is basically of a 7-stage logic circuit arrangement. The horizontal scanning circuit has a shift register stage as a first stage which comprises a plurality of cascaded ½ shift registers (½ S.R.) 151-1, 151-2, . . . . A shift pulse φHS is applied to the first ½ shift register 151-1.

Figure 16:
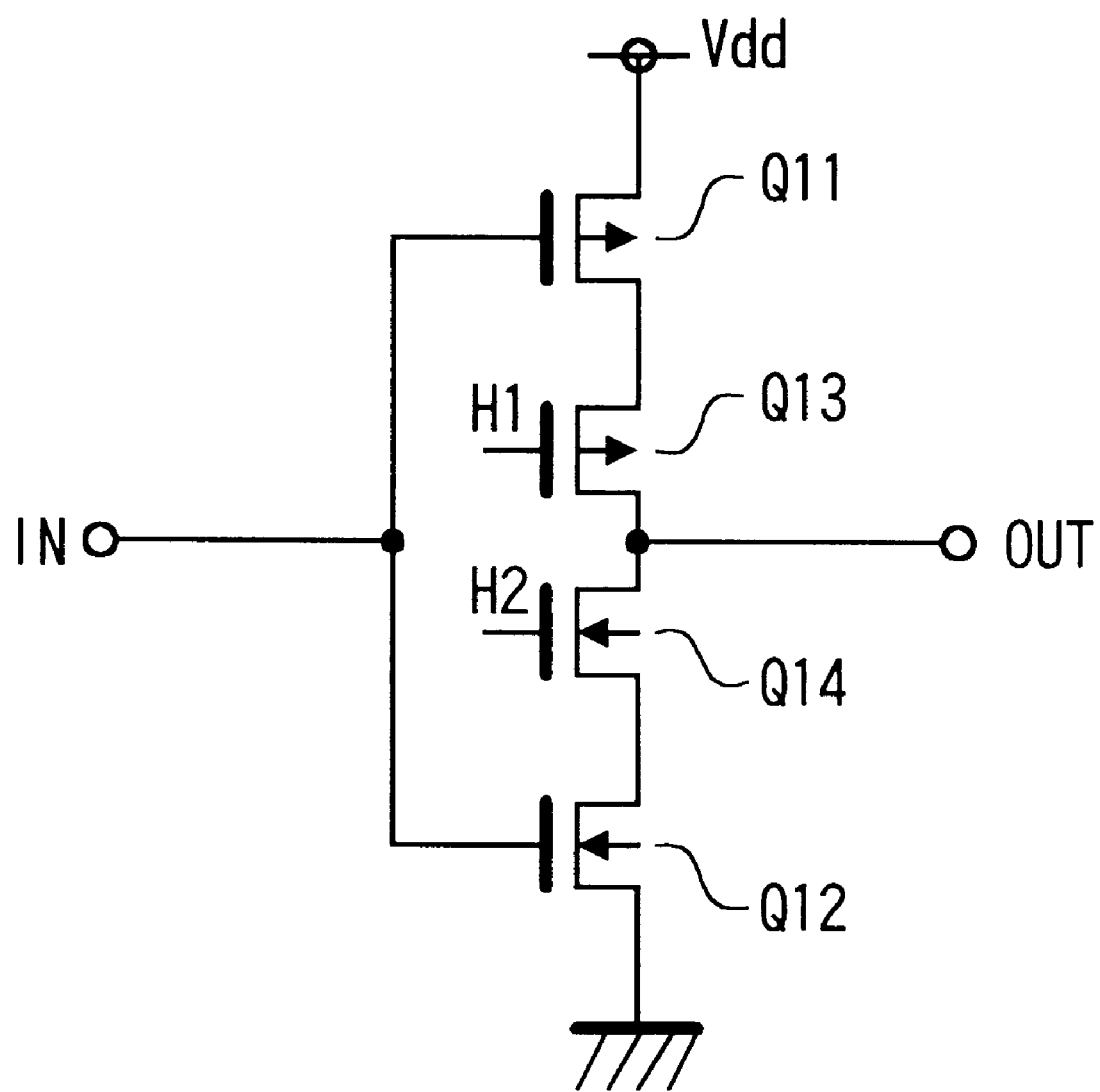
FIG. 16 is a circuit diagram of each of ½ shift registers in the horizontal scanning circuit shown in FIG. 15.

As shown in FIG. 16, each of the cascaded ½ shift registers 151-1, 151-2, . . . comprises a PMOS transistor Q11 having a source connected to a power supply Vdd, an NMOS transistor Q12 having a source connected to ground, and PMOS and NMOS transistors Q13, Q14 connected in series between the drains of the PMOS and NMOS transistors Q11, Q12. The gates of the PMOS and NMOS transistors Q11, Q12 are connected to an input terminal IN, and the drains of the PMOS and NMOS transistors Q13, Q14 are connected in common to an output terminal OUT. Pulses H1, H2 which are in opposite phase with respect to each other are applied respectively to the gates of the PMOS and NMOS transistors Q13, Q14.

The ½ shift registers 151-1, 151-2, . . . include odd-numbered ½ shift registers 151-1, 151-3, 151-5, . . . that are supplied with pulses H1 which are produced by inverting drive pulses φHCLK2 with an inverter 152, and also with pulses H2 which is produced by inverting twice the drive pulses φHCLK2 with an inverter 153. The ½ shift registers 151-1, 151-2, . . . include even-numbered ½ shift registers 151-2, 151-4, 151-6, . . . that are supplied with pulses H2 which are produced by inverting the drive pulses φHCLK2 with the inverter 152, and also with pulses H1 which is produced by inverting twice the drive pulses φHCLK2 with the inverter 153.

The horizontal scanning circuit has a second stage of NAND gates 154-1, 154-2, . . . associated with the shift registers of the first stage. The NAND gates 154-1, 154-2, . . . have respective input terminals supplied with drive pulses φHCLK1 which have a frequency twice the drive pulses φHCLK2 and which are inverted by an inverter 155. The NAND gate 154-1 has another input terminal supplied with output pulses (B) from the second ½ shift register 151-2, and the NAND gate 154-2 has another input terminal supplied with output pulses from the fourth ½ shift register 151-4.

The horizontal scanning circuit has a third stage of NOR gates 156-1, 156-2, 156-3, 156-4, . . . . The NOR gate 156-1 has two input terminals supplied respectively with output pulses (A) from the ½ shift register 151-1 and output pulses (E) from the NAND gate 154-1. The NOR gate 156-2 has two input terminals supplied respectively with output pulses (E) from the NAND gate 154-1 and output pulses (C) from the ½ shift register 151-3. The NOR gate 156-3 has two input terminals supplied respectively with output pulses (C) from the ½ shift register 151-3 and output pulses from the NAND gate 154-2. The NOR gate 156-4 has two input terminals supplied respectively with output pulses from the NAND gate 154-2 and output pulses from the ½ shift register 151-5.

The horizontal scanning circuit has a fourth stage of NOR gates 157-1, 157-2, 157-3, 157-4, . . . . The NOR gates 157-1, 157-3 have input terminals supplied with signal operation pulses φS1, and the NOR gates 157-2, 157-4 have input terminals supplied with noise operation pulses φN1. The NOR gate 157-1 has another input terminal supplied with output pulses (F) from the NOR gate 156-1. The NOR gate 157-2 has another input terminal supplied with output pulses (G) from the NOR gate 156-2. The NOR gate 157-3 has another input terminal supplied with output pulses from the NOR gate 156-3. The NOR gate 157-4 has another input terminal supplied with output pulses from the NOR gate 156-4.

The horizontal scanning circuit has a fifth stage of NOR gates 158-1, 158-2, 158-3, 158-4, . . . . The NOR gates 158-1, 158-3 have input terminals supplied with signal operation pulses φS2, and the NOR gates 158-2, 158-4 have input terminals supplied with noise operation pulses φN2. The NOR gate 158-1 has another input terminal supplied with output pulses from the NOR gate 156-1. The NOR gate 158-2 has another input terminal supplied with output pulses from the NOR gate 156-2. The NOR gate 158-3 has another input terminal supplied with output pulses from the NOR gate 156-3. The NOR gate 158-4 has another input terminal supplied with output pulses from the NOR gate 156-4.

The horizontal scanning circuit has a sixth stage of inverters 159-1, 159-2, 159-3, 159-4, . . . . The inverter 159-1 inverts output pulses (H) from the NOR gate 157-1 and outputs the inverted pulses as signal operation pulses φS1n−1 for the (n−1)th column. The inverter 159-2 inverts output pulses (I) from the NOR gate 157-2 and outputs the inverted pulses as noise operation pulses φN1n−1 for the (n−1)th column. The inverter 159-3 inverts output pulses from the NOR gate 157-3 and outputs the inverted pulses as signal operation pulses φS1n for the nth column. The inverter 159-4 inverts output pulses from the NOR gate 157-4 and outputs the inverted pulses as noise operation pulses φN1n for the nth column.

The horizontal scanning circuit has a seventh stage of inverters 160-1, 160-2, 160-3, 160-4, 160-5, 160-6, The inverter 160-1 inverts output pulses from the NOR gate 158-1 and outputs the inverted pulses as signal operation pulses φS2n−1 for the (n−1)th column. The inverter 160-2 inverts output pulses from the NOR gate 158-2 and outputs the inverted pulses as noise operation pulses φN2n−1 for the (n−1)th column. The inverter 160-3 inverts output pulses (E) from the NAND gate 154-1 and outputs the inverted pulses as horizontal scanning pulses φHn−1 for the nth column. The inverter 160-4 inverts output pulses from the NOR gate 158-3 and outputs the inverted pulses as noise operation pulses φN2n for the nth column. The inverter 160-5 inverts output pulses from the NOR gate 158-4 and outputs the inverted pulses as noise operation pulses φN2n for the nth column. The inverter 160-6 inverts output pulses from the NAND gate 154-2 and outputs the inverted pulses as horizontal scanning pulses φHn for the nth column.

Since the first stage comprises shift registers, the second stage comprises NAND gates, the third, fourth, and fifth stage comprise NOR gates, and the sixth and seventh stages comprise inverters, the horizontal scanning circuit can be constructed of a minimum number of gates assembled at small repetitive pitches. Since all stages are composed of similar logic circuits, the layout of the horizontal scanning circuit can advantageously be designed within a predetermined width.

Figure 17:
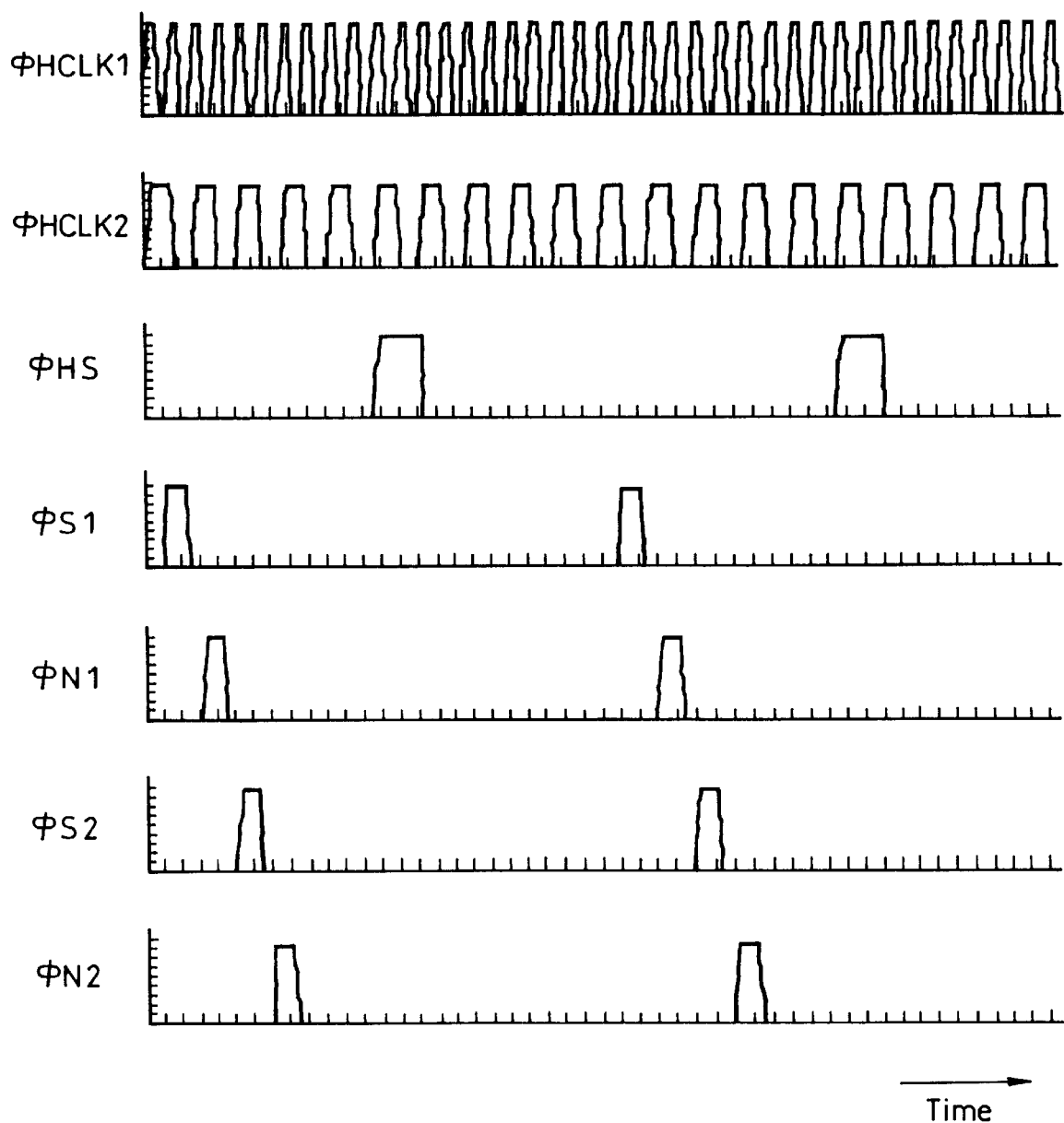
FIG. 17 is a diagram showing the waveforms of input pulses applied to the horizontal scanning circuit shown in FIG. 15.
Figure 18:
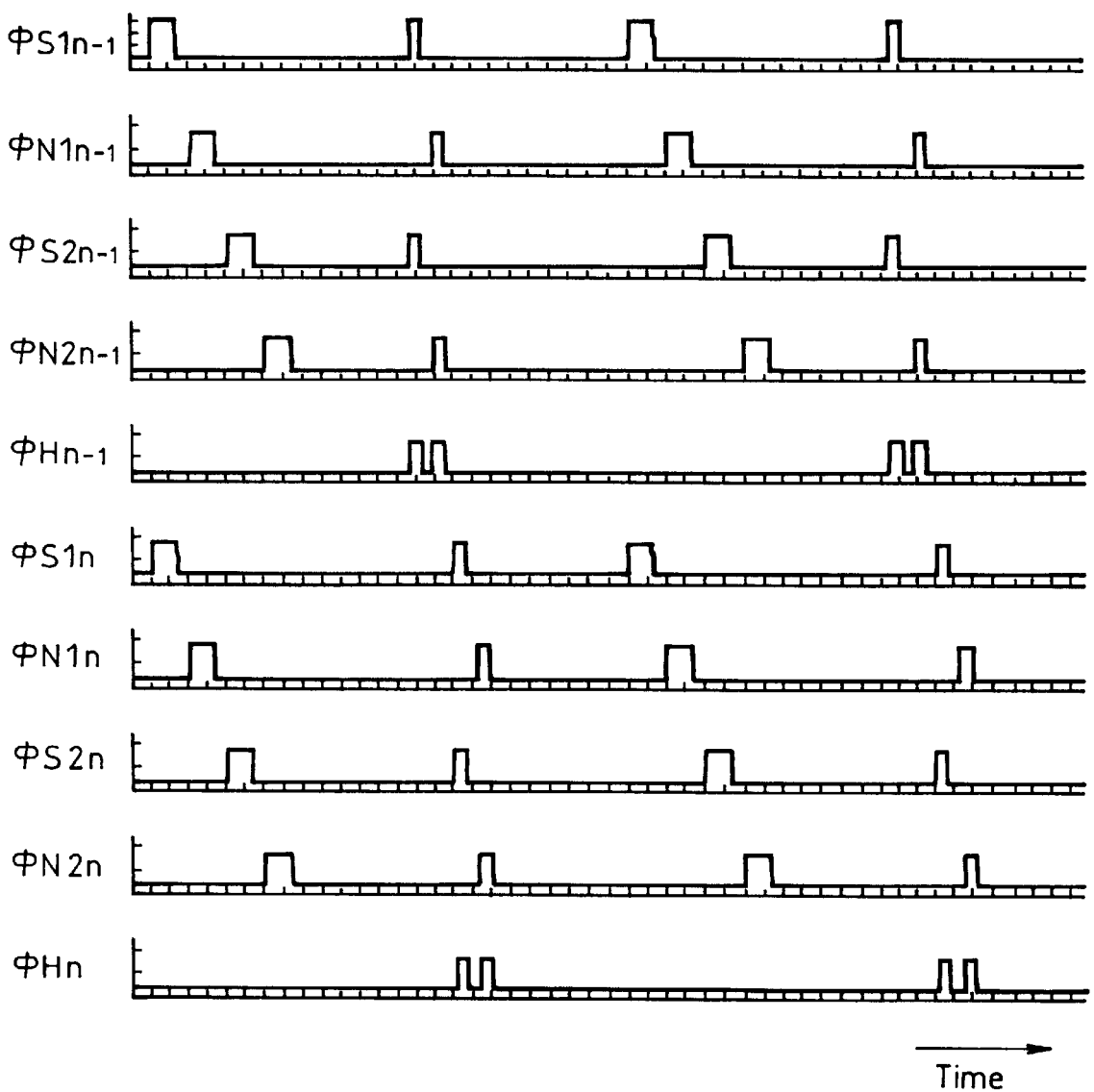
FIG. 18 is a diagram showing the waveforms of output pulses of the horizontal scanning circuit shown in FIG. 15.
Figure 19A:
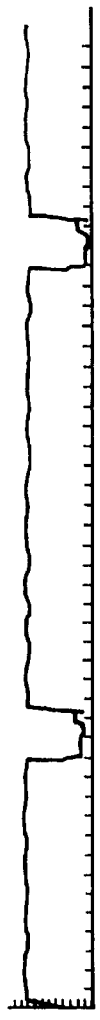
FIG. 19 is a diagram showing the waveforms of pulses in the horizontal scanning circuit shown in FIG. 15.
Figure 19B:
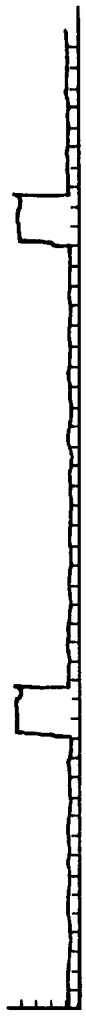
Figure 19C:
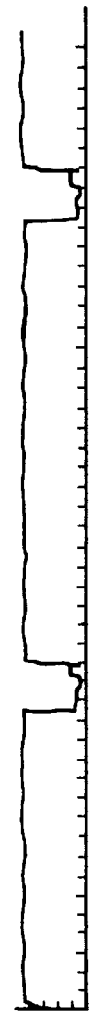
Figure 19D:
Figure 19E:
Figure 19F:
Figure 19G:
Figure 19H:
Figure 19I:

Results of a simulation effected on the horizontal scanning circuit are shown in FIGS. 17, 18, and 19. FIG. 17 shows the waveforms of input pulses applied to the horizontal scanning circuit, FIG. 18 shows the waveforms of output pulses of the horizontal scanning circuit, and FIG. 19 shows the waveforms of pulses in the horizontal scanning circuit. Operation of the horizontal scanning circuit will be described below with reference to FIGS. 17–19.

When a shift pulse φHS of an "H" level is applied to the first ½ shift register 151-1, the ½ registers 151-1, 151-2, 151-3, 151-4, 151-5, 151-6, . . . successively shift the shift pulse φHS in synchronism with drive pulses φHCLK2. Drive pulses φHCLK1(D), whose frequency is twice the frequency of the drive pulses φHCLK2, and output pulses (B) from the even-numbered ½ shift registers 151-2, 151-4, . . . the ½ shift register 151-2 will be described as an example below) are ANDed by the AND gate 154-1, whose output pulses are inverted by the inverter 160-3, producing horizontal scanning pulses φHn−1 (φHi).

As can be seen from FIG. 19, the output pulses (E) from the NAND gate 154-1 comprise two negative pulses. In order to separate these two negative pulses, an output pulse (A) from the ½ shift register 151-1 preceding the ½ shift register 151-2 and an output pulse (C) from the ½ shift register 151-3 following the ½ shift register 151-2 are applied to the NOR gates 156-1, 156-2, respectively, which produce two respective pulses (F), (G) as being separated from the two negative pulses.

The pulse (F) and the signal operation pulses φS1, φS2 in a horizontal blanking interval HLB are applied to the NOR gates 157-1, 158-1, which produce output pulses (H), (I). The output pulses (H), (I) are inverted respectively by the inverters 159-1, 160-1, producing signal operation pulses φS1n−1 (φS1i), φS2n−1 (φS2i), respectively. Similarly, noise operation pulses φN1n−1 (φN1i), φN2n−1 (φN2i) are produced respectively from the noise operation pulses φN1, φN2.

While the circuit arrangement shown in FIG. 15 is used as the horizontal scanning circuit 124 in the amplification-type solid-state imaging device according to the fifth embodiment, the horizontal scanning circuit 144 in the amplification-type solid-state imaging device according to the sixth embodiment is basically of the same circuit arrangement as shown in FIG. 15. However, as can be understood from a comparison between the timing charts shown in FIGS. 12 and 14, the signal operation pulses φS1, φS2 and the noise operation pulses φN1, φN2 in the horizontal scanning circuit 124 have different polarities from those in the horizontal scanning circuit 144.

Therefore, the horizontal scanning circuit 144 has an eighth stage of inverters for producing the signal operation pulses φS1, φS2 and the noise operation pulses φN1, φN2, in addition to the circuit arrangement shown in FIG. 15. The horizontal scanning circuit 144 thus arranged is suitable for use in the amplification-type solid-state imaging device which employs diodes according to the sixth embodiment.

In the fifth and sixth embodiments, since the signal and noise operation switches are positioned adjacent to each other, they are equally affected by manufacturing processes for producing the amplification-type solid-state imaging device. Therefore, their characteristic variations are held to a minimum, and fixed pattern noise due to such characteristic variations can reliably be removed.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A solid-state imaging device comprising:
    a matrix of pixels arranged in rows and columns;
    a first signal holding circuit for holding a first signal transferred from one of said pixels before said pixel is reset;
    a second signal holding circuit for holding a second signal transferred from said one pixel after said pixel is reset; and
    a horizontal signal line group connected to said first signal holding circuit and said second signal holding circuit, said first signal holding circuit and said second signal holding circuit being positioned one on each side of said horizontal signal line group wherein said first and second signals are successively output via the horizontal signal line group;
    a driver circuit for generating drive pulses for energizing said first signal holding circuit and said second signal holding circuit; and
    a correlated double signal sampling circuit connected to said horizontal signal line group, for effecting a correlated double signal sampling on said first signal and said second signal received from said horizontal signal line group.

2. A solid-state imaging device according to claim 1, wherein said first signal represents a image.

3. A solid-state imaging device according to claim 1, wherein said second signal represents an noise signal.

4. A solid-state imaging device according to claim 1, wherein said horizontal signal line group comprises only one signal line.

5. A solid-state imaging device according to claim 1, wherein said horizontal signal line group comprises a signal line.

6. A solid-state imaging device according to claim 1, wherein said first signal holding circuit and said second signal holding circuit are axially symmetric with respect to said horizontal signal line group which is disposed therebetween.

7. A solid-state imaging device according to claim 1, further comprising:
    a plurality of vertical signal lines connected respectively to the columns of the pixels;
    said first signal holding circuit and said second signal holding circuit being connected to said vertical signal lines.

8. A solid-state imaging device according to claim 1, further comprising:
    a first interconnection connecting said driver circuit to said first signal holding circuit; and
    a second interconnection connecting said driver circuit to said second signal holding circuit;
    said first interconnection and said second interconnection having substantially the same length as each other.

* * * * *